United States Patent
Mathur et al.

(10) Patent No.: US 11,916,549 B1
(45) Date of Patent: Feb. 27, 2024

(54) TWO-STAGE HIGH SPEED LEVEL SHIFTER

(71) Applicant: SanDisk Technologies LLC, Addison, TX (US)

(72) Inventors: Shiv Harit Mathur, Bangalore (IN); Sai Ravi Teja Konakalla, Bangalore (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/898,263

(22) Filed: Aug. 29, 2022

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC ................................ H03K 19/018514–018528
See application file for complete search history.

(56) References Cited

U.S. PATENT DOCUMENTS

| | | | |
|---|---|---|---|
| 8,228,745 B2 | 7/2012 | Patil | |
| 9,250,696 B2 | 2/2016 | Kumar | |
| 9,374,090 B2 | 6/2016 | Zhou | |
| 9,748,957 B2 | 8/2017 | Kumar | |
| 9,806,716 B2 * | 10/2017 | Dey | .................. H03K 19/0013 |
| 10,608,618 B1 * | 3/2020 | Ekambaram | ..... H03K 3/356182 |
| 2022/0057824 A1 | 2/2022 | Dey | |
| 2023/0198524 A1 * | 6/2023 | Mathur | .................. H03K 3/037 327/333 |

* cited by examiner

*Primary Examiner* — Patrick O Neill
(74) *Attorney, Agent, or Firm* — Hector A. Agdeppa; SHEPPARD, MULLIN, RICHTER & HAMPTON LLP

(57) ABSTRACT

Improved voltage level shifters are disclosed capable of achieving substantially higher data transfer speeds with reduced static current than existing cross-coupled voltage level shifters. The voltage level shifters disclosed herein include first stage that translates input voltage signals received from a core circuitry in a first voltage domain to intermediate output voltage signals an intermediate voltage domain, and second stage circuitry that translates the intermediate output voltage signals received from the first stage circuitry in the intermediate voltage domain to output voltage signals in a second voltage domain. The disclosed voltage level shifters are scalable to support various logic voltage levels in the second voltage domain.

20 Claims, 13 Drawing Sheets

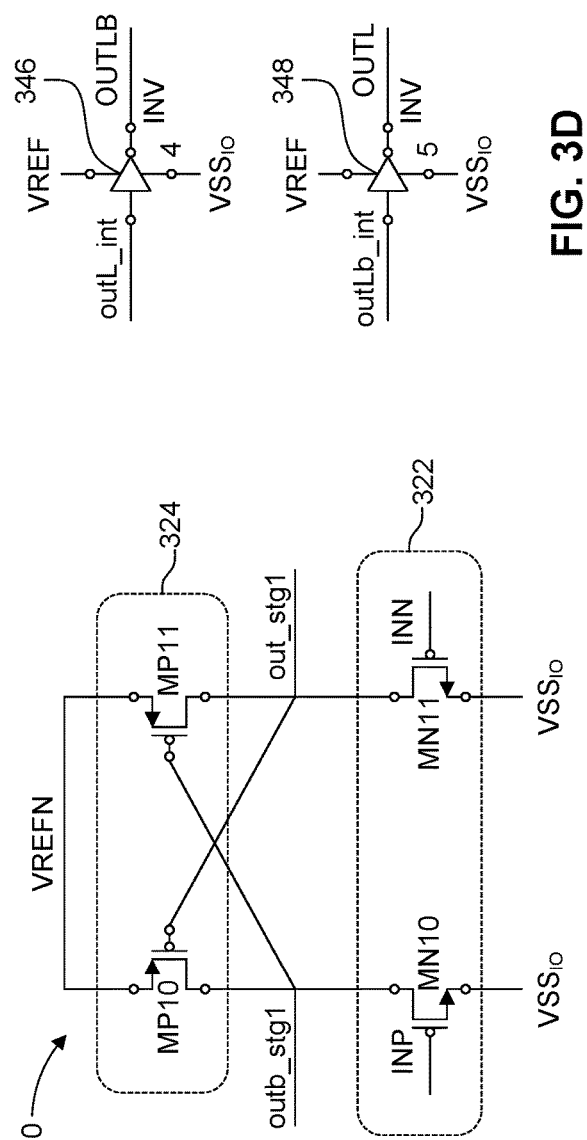
FIG. 3D
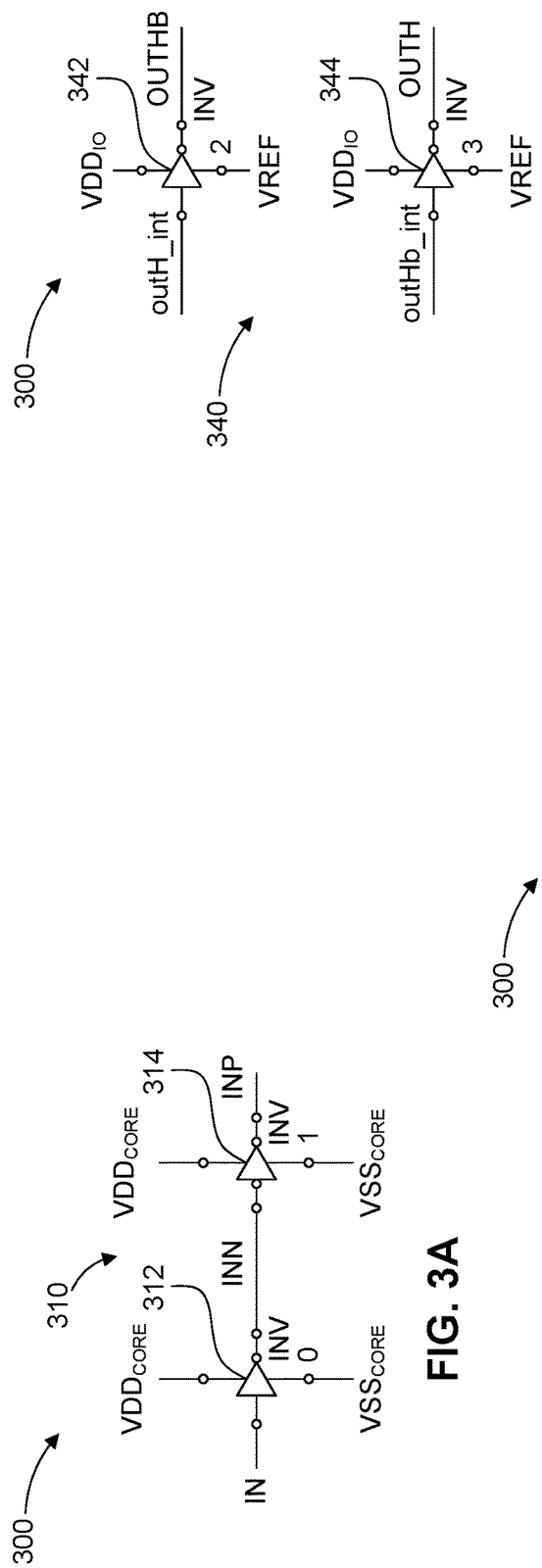
FIG. 3B
FIG. 3A

US 11,916,549 B1

TWO-STAGE HIGH SPEED LEVEL SHIFTER

BACKGROUND

A level shifter—also referred to at times as a level translator, a logic-level shifter, a voltage level shifter, or a voltage level translator—is an electronic circuit that translates input signals having voltage logic levels in a first voltage domain to output signals having voltage logic levels in a second voltage domain. Level shifters include step-up level shifters, where one or more voltage logic levels in the first voltage domain are lower than a corresponding one or more voltage logic levels in the second voltage domain, and step-down level shifters, where one or more voltage logic levels in the first voltage domain are higher than a corresponding one or more voltage logic levels in the second voltage domain. Level shifters may be configured in chips or dies having different operational domains and/or interfaces. Level shifters may be used as the building blocks for integrated circuit (IC) design, including those that employ complementary metal-oxide-semiconductor (CMOS) technology. Level shifters may enable compatibility between ICs with different voltage requirements, for example.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIGS. 3A, 3B, 3C, and 3D depict a circuit implementation of the two-stage high-speed level shifter of FIG. 2 according to embodiments of the disclosed technology.

Figure 1:
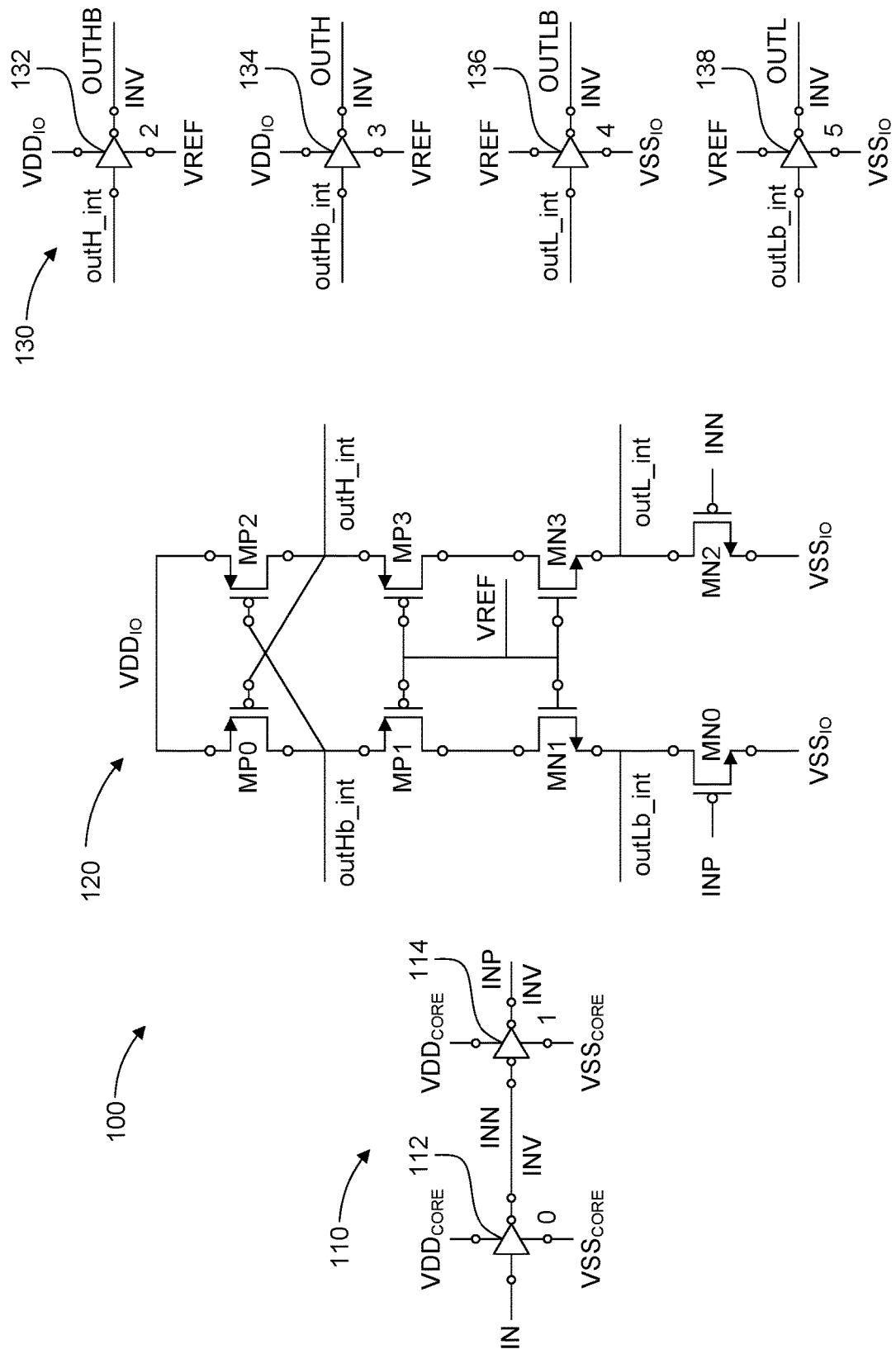
FIG. 1 depicts a circuit implementation of a cross-coupled voltage level shifter.

The figures are not exhaustive and do not limit the present disclosure to the precise form disclosed.

DETAILED DESCRIPTION

Level shifters are widely used in IC design to perform voltage level translation. For instance, a level shifter may sit on a data path connecting a first IC and a second IC fabricated on respective dies. To reduce power consumption and increase performance, an operating voltage within an IC's core is typically lower than outside the IC core. As such, the lower voltages exiting the first IC may be more susceptible to distortion as they travel along the data path to the second IC due to noise present in the environment between the two ICs. To mitigate the effect of this distortion due to noise, conventional step-up level shifters may be used to convert voltages leaving the first IC from the lower operating voltage in the first voltage domain of the first IC, for example 0.9V for some example first ICs, to the higher operating voltage in the second voltage domain of the environment external to the first IC, e.g., 3.3V for some example second ICs. More generally, a step-up level shifter may convert input voltages in a first voltage domain to output voltages in a second voltage domain such that at least one voltage in the first voltage domain (e.g., a voltage in the first voltage domain that corresponds to a logic high level) is lower than a corresponding voltage in the second voltage domain (e.g., a voltage in the second voltage domain that corresponds to the logic high level). A step-down level shifter may then be used to convert the voltages prior to entering the second IC from the higher operating voltage of the external environment to the lower core operating voltage of the second IC. More generally, a step-down level shifter may convert input voltages in a first voltage domain to output voltages in a second voltage domain such that at least one voltage in the first voltage domain (e.g., a voltage in the first voltage domain that corresponds to a logic high level) is higher than a corresponding voltage in the second voltage domain (e.g., a voltage in the second voltage domain that corresponds to the logic high level).

Due to technology scaling, electrical devices and the ICs (e.g., both IC core and ICs external to the IC core) used to build them are getting smaller to provide for increases in processing speeds. However, due to this scaling, even those IC devices external to the IC core may be unable to support high operating voltage levels in the second voltage domain, for example, 3.3V. Moreover, when exposed to higher voltage levels in the second voltage domain, IC devices of reduced size may be damaged when exposed to voltage logic levels beyond their voltage level limit (e.g., an electrical overstress limit). For example, IC core devices having a gate a thickness of 28 nm or more (an example of a thin-gate IC device) are able to support operating voltages 0.9V or less, while external IC devices having a gate thickness of 35 angstroms (Å) or less (an example of a thick-gate IC device) are able to support voltage levels of 1.8V or less. As such, advancements in level shifter designs provide for converting logic states in the first voltage domain to the second voltage domain that operates at a lower voltage level of the conventional design (e.g., the operating voltage level of 1.8V compared to 3.3V of the conventional design). For example, a step-up level shifter may be used to convert voltages leaving the first IC from the operating voltage in the first voltage domain (e.g., 0.9V) to the lower operating voltage in the second voltage domain of an environment external to the first IC that operates at a voltage level of 1.8V. Similarly, a step-down level shifter may be used to convert the voltages prior to entering a second IC from the operating voltage in the second voltage domain to the lower core operating voltage of the first IC.

Yet, in many applications, there remains a need to provide continued support for operating voltages at a voltage levels above the electrical overstress limit of the thick-gate IC devices (e.g., above 1.8V), such as 3.3V. That is, there remains a need to support environments operating in a second voltage domain having a first, high operating voltage of 3.3V, while also supporting environments operating in the second voltage domain having a second, low operating voltage of 1.8V. For example, backward compatibility with electrical devices and external environments that rely on operating voltages in the second voltage domain that are higher than the operating voltages of recent electrical devices (e.g., 3.3V compared to 1.8V). As another example, some product lines, products, and/or customer operating specifications and/or requirements may require support for various operating voltages in the second voltage domain. For example, RPG-SD/uSD/SD Express Card product lines each require support for first operating voltages (e.g., 3.3V) and second operating voltage (e.g., 1.8V) in the second domain.

One approach that has been implemented to support higher operating voltages in the second voltage domain has been to use additional masks to fabricate thicker-gate devices having gate thicknesses larger than 35 Å (e.g., 50 Å), which are provided along with the thick-gate IC devices (e.g., ICs having 35 Å gate thickness). However, in many situations it is not possible to provide devices of multiple thicknesses, such as one with a gate thickness of 35 Å and one of 50 Å. Furthermore, using a thicker device to support the higher operating voltage leads to overall performance loss and devices having larger physical footprints.

Cross-coupled level shifters, such as those having the example circuit implementation depicted in FIG. 1, have also been used to perform signal conversion between a low first voltage domain (e.g., 0.9V) and a high second voltage domain (e.g., 1.8V). This type of architecture uses thick-gate IC devices having 35 Å thick gates and a reference voltage VREF to support operating voltages above the electrical overstress limit of the thick-gate IC devices. For example, a reference voltage of 50% of the operating voltage in the second domain (e.g., 3.3V) is applied to safeguard the thick-gate IC devices from electrical overstress. In addition, this architecture operates according to a N-to-P device ratio of 10-15 times (e.g., the width of nMOS devices is 10 to 15 times larger than the width of the pMOS devices) to enable the voltage conversion and a balanced duty-cycle. For example, in cross-coupled level shifter designs such as that shown in FIG. 1, lower portion of n-channel metal-oxide-semiconductor field-effect transistors (nMOS) are exposed to the lower operating voltage (e.g., $VDD_{CORE}$) in the first voltage domain, while the upper portion of p-channel metal-oxide-semiconductor field-effect transistors (pMOS) are exposed to an overdrive of higher supply voltage (e.g., $VDD_{IO}$) in the second voltage domain. Thus, there exist a ratio of the width of nMOS devices to width of pMOS devices that is maintained to balance the current in the circuit. A higher difference between supply voltages $VDD_{CORE}$ and $VDD_{IO}$ translates to maintaining a higher ratio.

FIG. 1 depicts a circuit implementation 100 of an example conventional cross-coupled level shifter. The circuit 100 includes an input circuitry 110, a level shifter circuit 120, and an output circuit 130. The circuit 100 converts an input signal IN having a voltage VIN that transitions between a high voltage level and a low voltage level in a first domain to an output signal OUT that has a voltage VOUT that transitions between a high level and a low level in a second domain. Particularly, the circuit 100 converts a voltage level in the first voltage domain of an input logic level on the input signal to a voltage level in the second voltage domain for an output logic level. For the example circuit 100, the first domain may include a high voltage level $VDD_{CORE}$ and a low voltage level $VSS_{CORE}$, and the second domain may include a high voltage level $VDD_{IO}$ and a low voltage level $VSS_{IO}$. For some example level shifter applications, the circuit 100 may be a low-to-high level shifter in that the high voltage level $VDD_{IO}$ in the second domain may be higher than the high voltage level $VDD_{CORE}$ in the first domain.

Additionally, low voltage levels $VSS_{CORE}$, $VSS_{IO}$ may both be ground reference voltages in their respective domains. In addition, the high voltage level $VDD_{IO}$ may include multiple voltage levels, each higher than the high voltage level $VDD_{CORE}$ of the first domain. As an example, at some times or during some operations, the high voltage level $VDD_{IO}$ may be a first high voltage level in the second voltage domain and, at other times or during other operations, the high voltage level $VDD_{IO}$ may be a second high voltage level of the second voltage domain. Example first and second high voltage levels may be 0.9 volts and 3.3. volts, respectively. Various levels for the first and second voltage domains may be possible.

The level shifter circuit 120 may be any circuit configured to convert one or more input signals in a first domain to output signals in the second domain. For some example circuit configurations, as shown in FIG. 1, the circuit 120 may be a cross-coupled level shifter configured to generate a first and second pairs of intermediate complimentary signals at different voltage levels. For example, circuit 120 generates first pair including intermediate signal outH_int and its complimentary signal outHb_int at a first voltage level in the second voltage domain and second pair including intermediate signals outL_int and its complimentary signal outLb_int at a second voltage level in the second voltage domain, where the second voltage level is lower than the than the first voltage level. As shown in FIG. 1, signal outH_int is generated at a node coupled to a drain terminal of a pMOS transistor MP0, and its complimentary signal outHb_int is generated at a node coupled to a drain terminal of a pMOS transistor MP2. The level shifter circuit 120 may be considered "cross-coupled" in that a gate terminal of the pMOS transistor MP0 is coupled to the drain terminal of the pMOS transistor MP2 and configured to receive the intermediate signal outH_int, and a gate terminal of the pMOS transistor MP2 is coupled to the drain terminal of the pMOS transistor MP0 and configured to receive the complimentary signal outHb_int. The cross-coupling of MP0 and MP2 forms a cross-coupled latch.

Furthermore, the circuit 100 includes first and second pull-down n-type MOS (nMOS) transistors MN0 and MN2 and nMOS transistors MN1 and MN3 having source terminals coupled to drain terminals of MN0 and MN2, respectively. The drain terminals of MN1 and MN3 are coupled to drain terminals of pMOS transistors MP1 and MP3, respectively, which have their source terminals coupled to the drain terminals of MP0 and MP2, respectively. Gate terminals of MN1, MN2, MP1, and MP3 receive a reference voltage VREF, which is set to half of $VDD_{IO}$ so to keep voltage levels on the nMOS and pMOS devices lower than the electrical overstress limits. As shown in FIG. 1, the second pair of intermediate complimentary intermediate signals outL_int and outLb_int are generated at nodes coupled to the source terminal of MN3 and MN1, respectively.

In operation, when an input voltage is set to logic low level (e.g., IN=0), INN is set to logic high level (e.g., INN=1) and voltage of $VDD_{CORE}$ is supplied to the gate terminal of MN2, and INP (e.g., INP=0) is set to logic low level and a voltage of $VSS_{CORE}$ is supplied to a gate terminal of MN0, due to the operation of inverters 112 and 114, respectively. Since INN=1, the corresponding gate voltage supplied to MN2 (e.g., $VDD_{CORE}$) is sufficient to overcome a threshold voltage Vt of MN2, and MN2 and MN3 are turned ON (also referred to herein as activation). Conversely, because INP=0, MN0 and MN1 are OFF. As a result, signal outL_int is set to logic low level, signals outLb_int and outH_int are at VREF, and signal outHb_int is at $VDD_{IO}$. As shown in FIG. 1, the intermediate signal outH_int is inverted by inverter 132 to produce output voltage OUTHB, the intermediate signal outHb_int is inverted by inverter 134 to produce output voltage OUTH, intermediate signal outL_int is inverted by inverter 136 to produce output voltage OUTLB, and the intermediate signal outLb_int is inverted by inverter 138 to produce output voltage OUTL. Thus, when the input voltage IN is at the logic low level, the output voltage from the circuit 100 may also be at VREF (e.g., OUTH=VREF, OUTHB=$VDD_{IO}$, OUTL=$VSS_{IO}$, and OUTLB=VREF).

When IN transitions from logic low level to logic high level, INP transitions to logic high level and a voltage of $VDD_{CORE}$ is supplied to a gate terminal of MN0. INP transitioning to logic high results in a gate voltage supplied to MN0 that is sufficient to overcome a Vt of MN0 and turn MN1 and MP1 ON. For example, as MN0 turns ON, signal outLb_int discharges to $VSS_{IO}$, which turns MN1 ON. Because MP0 is also ON and because MN0 is made stronger than MP0 by design, outHb_int at a drain side of MP0 begins to discharge toward VREF. Once it has discharged by at least a Vt of MP2 (i.e., $VDD_{IO}$–Vt), then MP2 turns ON, thereby triggering a latch action. For example, the drain side node outH_int of MP2 pulls down on the gate terminal of MP0, resulting in outHb_int going to the logic low level 0 and outH_int charging to the logic high level. The latch action then maintains outHb_int at VREF. In parallel, INN transitions to logic low level, which turns MN3 and MN2 OFF. Consequently, signal outH_int is latched at $VDD_{IO}$ during the latch action.

When IN transitions from logic high level to logic low level, INN transitions to logic high level and a voltage of $VDD_{CORE}$ is supplied to a gate terminal of MN2. INN transitioning to logic high results in a gate voltage supplied to MN2 that is sufficient to overcome a Vt of MN2 and turn MN3 and MP3 ON. Because MP2 is also ON and because MN2 is made stronger than MP2 by design, outH_int at a drain side of MP2 begins to discharge. Once it has discharged by at least a Vt of MP0 (i.e., $VDD_{IO}$–Vt), then MP0 turns ON, thereby triggering a complementary latch action. For example, the drain side node outHb_int of MP0 pulls down on the gate terminal of MP2, resulting in out18_int going to the logic low. Accordingly, outL_int is set to logic low level, outLb_int is at VREF, outHb_int is at $VDD_{IO}$, and outH_int is at VREF. Thus, when the input voltage IN transitions to the logic low level, the output voltage from the circuit 100 may also be at VREF (e.g., OUTH=VREF, OUTHB=$VDD_{IO}$, OUTL=$VSS_{IO}$, and OUTLB=VREF).

However, the conventional cross-coupled level shifter architecture of FIG. 1 suffers from various technical problems, particularly with respect to the level shifter's ability to achieve higher target performance and consume less static current.

N-channel MOS (nMOS) pull-down devices within the conventional cross-coupled level shifter design receive input voltages and initiate a state transition for the pMOS-based latch. These nMOS devices have a substantially larger current requirement than the pMOS devices. In particular, the nMOS pull-down devices need to generate enough current to pull-down the voltage at corresponding drain side nodes of the pMOS devices by at least corresponding threshold voltages of the pMOS devices in order to enable the latch action. To meet this larger current requirement, the nMOS devices have a larger area than the pMOS devices. Further, nMOS devices are driven by supply voltage $VDD_{CORE}$ and see much lower overdrive voltage (difference between the gate to source voltage $V_{GS}$–Vt). As the input voltages to the level shifter are reduced, the width requirements for an nMOS pull-down device increases even further because its threshold voltage Vt does not generally scale with the operating voltage of the technology employed.

A further technical problem associated with the conventional cross-coupled level shifter design is that as the size of an nMOS device increases to meet the current requirements associated with increased target speed requirements, the parasitic capacitance at output nodes of the level shifter also increases due to the larger size of the device leading to Miller capacitance between input and output nodes. Thus, while increasing the area of an nMOS device to generate more current through the device at a given input voltage can assist with achieving higher data transfer speeds up to a certain threshold speed, any additional current increase achieved by further increases to the size of the nMOS device would be offset completely by a corresponding increase in the parasitic capacitance at the output nodes. As such, this existing cross-coupled level shifter design is incapable of achieving data speeds/performance above this threshold speed at which the increase in current is completely offset by the increased parasitic capacitance.

Thus, in the conventional level shifter design, the pull-down nMOS transistors of the level shifter circuit 120 (e.g., MN0 and MN2) need to be larger in width than the pMOS latch transistors (MP0 and MP2) in order to satisfy the higher current requirements of the nMOS transistors. More specifically, the size of the pMOS transistors (MP0 and MP2) may be determined based on the parasitic capacitance on intermediate nodes outHb_int and outH_int of the level shifter circuit 120, the overdrive voltage ($VDD_{IO}$–Vt), and the frequency of operation. The size of the nMOS transistors (MN0 and MN2), on the other hand, is determined based on the parasitic capacitance on intermediate nodes outLb_int and outL_int, the overdrive voltage ($VDD_{CORE}$–Vt), and the frequency of operation. Because, in the case of a step-up level shifter, $VDD_{CORE}$ is less than $VDD_{IO}$ (at least at the logic high level), the overdrive voltage at the nMOS transistors will be less than the overdrive voltage at the pMOS transistors. As such, the nMOS transistors need to be larger than the pMOS transistors in order to overcome the deficiency in the overdrive voltage for the nMOS transistors and ensure that there is enough current through these transistors to trigger the latch action. But, as also noted earlier, as the size of the nMOS transistors increases, so too does the parasitic capacitance at the output nodes of the level shifter circuit 120, until a point is reached at which any further current gains that result from size increases are completely offset by corresponding increases in the parasitic capacitance, thereby limiting performance.

Furthermore, due to conversion limitation of cascoded nets like outHb_int and outLb_int, a subthreshold conduction allows outHb_int and outLb_int to reach stable states of VREF. The drivers thus live with static current paths and thus, the conventional level shifter design is NOT power efficient. For example, nMOS devices cannot produce a true logic 1 state and similarly pMOS devices experience limits at a logic 0 state. As these device enter into subthreshold conduction region as soon as their respective threshold voltages Vt are reached across their respective gate-source terminal. Subthreshold currents being exponential in nature, result in taking large time to settle a respective node to its DC state. For example, when IN is set to 0, outL_int discharges to 0 quickly, which subsequently turns ON MN3, resulting in the voltage at a node between MP3 and MN3 to discharge to 0. This results in pulling down signal outH_int. However, MP3 is allowed to discharge it up to a voltage level of VREF plus its threshold voltage Vt using conduction current, and then the discharging towards the VREF point is determined by subthreshold current on MP3. However, as long as VREF plus Vt of MP3 point is good enough to turn MP0 ON (e.g., $VDD_{IO}$ mins Vt of MP3 is less than VREF plus Vt of MP3), the latch action will trigger and outHb_int can be charged to $VDD_{IO}$. Similarly, when IN is set to 0, MN0 turns OFF. MN1, initially ON as outLb_int was at 0, charges outLb_int to its threshold voltage Vt using conduction current, and then further charges towards VREF using subthreshold current. Accordingly, a significant amount of time is needed for both outHb_int and outL_int to reach VREF and connected the inverters (or drivers) (e.g., inverters 132-138) conduct crowbar current until the signals of the level shifter circuit 120 settle to their final values. As a result, the leakage on the inverters of the output circuit 130 is high because it takes time to reach logic values.

Figure 2:
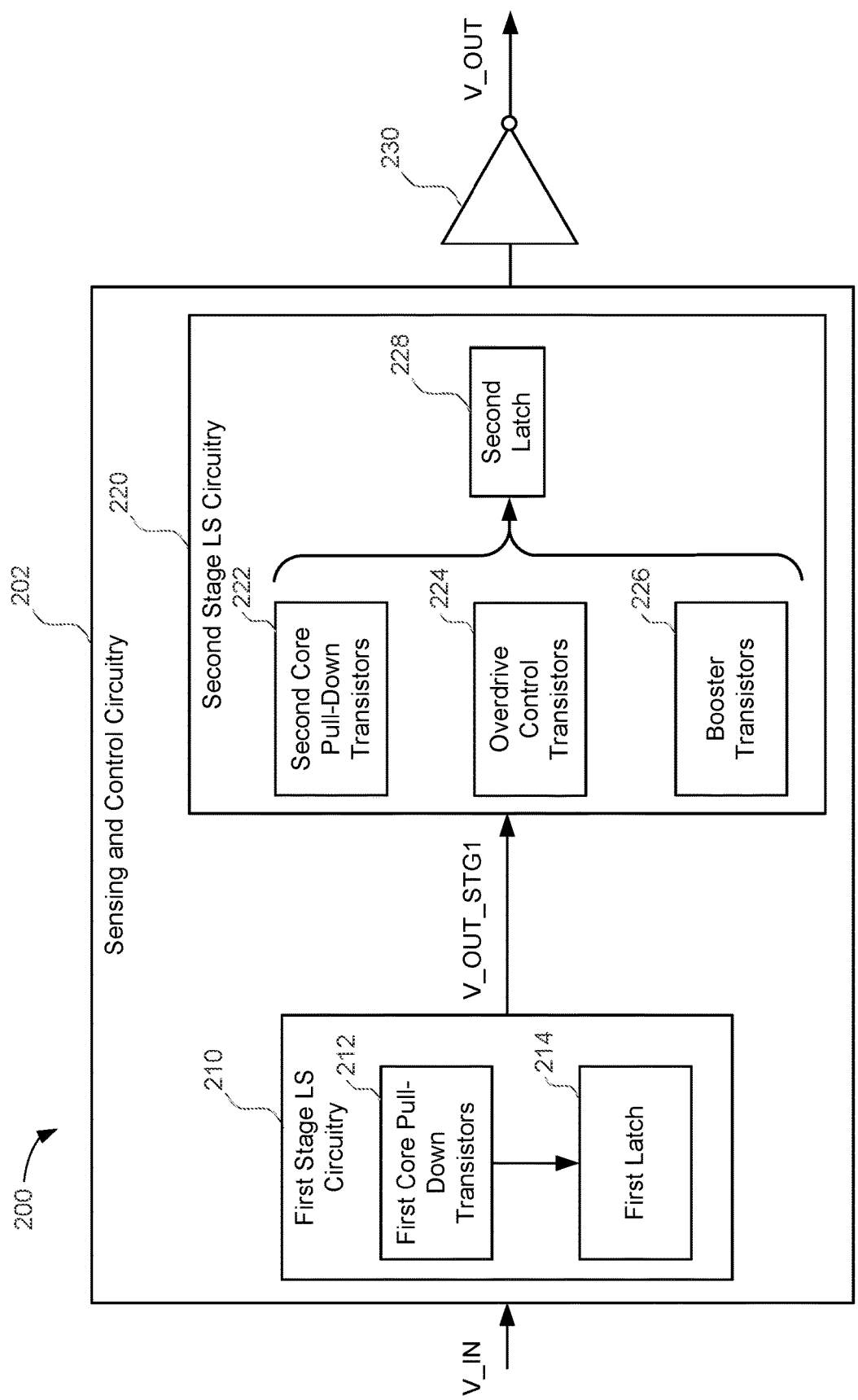
FIG. 2 is a block diagram of a two-stage high-speed voltage level shifter according to embodiments of the disclosed technology.

FIG. 2 is a block diagram of a two-stage high-speed voltage level shifter 200 having an improved cross-coupled design according to embodiments of the disclosed technology. The level shifter 200 is configured to convert input signals V_IN, from a core IC (also referred to as core circuitry) that transition between a high voltage level (e.g., logic high level at the high voltage level) and a low level (e.g., logic low level at the low voltage level) in a first voltage domain to output signals V_OUT that transitions between a high voltage level and a low voltage level in a second voltage domain. The level shifter 200 may be a step-up level shifter in that at least one of the voltage levels in the first voltage domain is lower than at least one corresponding voltage level in the second voltage domain. For example, a high voltage level, corresponding to a logic high level, in the first domain may be lower than a high voltage level in the second voltage domain. In some cases, the low voltage level, corresponding to a logic low level, in the first voltage domain may be the same as the logic low voltage level in the second voltage domain. For example, the logic low voltage level in each domain may be a ground reference voltage. In some example configurations, however, the ground reference voltages in the different domains may be different despite having the same direct current (DC) voltage, such as by being reference voltages for different or separate circuits or chips of the level shifter. In alternative example configurations, both the logic high and the logic low voltage levels may be lower in the first voltage domain than in the second voltage domain. Various configurations of logic voltage levels between the first and second voltage domains are possible for the level shifter 200.

Furthermore, the level shifter 200 is configured to support operation at a first, low operating voltage in the second voltage domain and a second, high operating voltage in the second voltage domain. That is, the level shifter 200 is configured to convert input signals V_IN on the first voltage domain to an output signal in a second voltage domain, based on an input operating voltage (e.g., $VDD_{IO}$ as described above in connection with FIG. 1). For example, level shifter 200 converts an input signal in a first domain that transitions between high voltage level $VDD_{CORE}$ and a low voltage level $VSS_{CORE}$ to the second domain that transitions between a high voltage level $VDD_{IO}$ and a low voltage level $VSS_{IO}$. The level shifter 200 is configured to support $VDD_{IO}$ set to a first, low operating voltage (e.g., 1.8V) and a second, high operating voltage (e.g., 3.3V).

While the present disclosure refers to operating voltage levels in the second voltage domain as 1.8V and/or 3.3V and the operating voltage in the first voltage domain as 0.9V, these voltage levels are examples and used for illustrative purposes. Other example operating voltage levels in the second domain may include, but are not limited to, 1.2V, 2.0V, 3.3V, and to name a few. Similarly, examples of other voltage levels in the first domain include, but are not limited to, 1.1V, 0.9V, 0.8V, and 0.72V. The operating voltage level of the second voltage domain is a voltage level that greater than the voltage level in the first voltage domain supported by the IC devices operating in the first voltage domain. That is, the second domain need only be a voltage level that exceeds the electrical overstress limit of the IC devices operating in the first voltage domain.

The level shifter 200 according to embodiments of the disclosed technology includes sensing and control circuitry 202 that comprises a first stage level shifter circuitry 210 and a second stage level shifter circuitry 220. The first stage level shifter circuitry 210 includes first core pull-down transistors 212 and first latch transistors 214, each of which includes electrical devices (e.g., MOSFETS) capable of supporting supply voltage in an intermediate or third voltage domain. Since the first core pull-down transistors 212 support the intermediate voltage domain, the devices need not be cascoded and do not suffer from the technical shortcomings described in connection with FIG. 1. The first stage output voltage V_OUT_STG1 from the first stage level shifter circuitry 210 may be at a logic high level or a logic low level of the intermediate voltage domain. Gate voltages corresponding to a logic level of the first stage output voltage V_OUT_STG1 or the logic level of the inversion of first stage output voltage V_OUT_STG1 may be supplied to various ones of the second core pull-down transistors 222 to trigger a corresponding latch action of a second latch 228. The latch action that is triggered may correspond to one or the other of two possible latch states—a first latch state in which the latch 228 maintains a voltage on an output node of second stage level shifter circuitry 220 at one of a logic high level or a logic low level and a second latch state in which the latch 228 maintains the voltage at the output node at the other of the logic high level or the logic low level.

In various embodiments, the first and second core pull-down transistors 212 and 222 may be thick-gate IC devices that support voltage operation in the second voltage domain. However, the electrical overstress limit for the thick-gate IC devices changes in accordance with the thickness of the gate of the IC devices. For example, as the gate thickness decrease so does the electrical overstress limit, and exposure of the thick-gate IC devices to voltages exceeding their electrical overstress limit leads to permanent damage to the devices. As an illustrative example, embodiments herein comprise core pull-down transistors having electrical overstress limits of less than 3.3V, and more particularly less than 2.0V. In various embodiments, the core pull-down transistors 212 and 222 are thick-gate IC device having gate thicknesses of 35A or less, which have an electrical overstress limit of 1.98V or less. Accordingly, exposure of the core pull-down transistors 212 and 222 to voltages greater than 1.98V (e.g., 3.3V when converting from the first voltage to domain to the second voltage domain for certain applications) could result in damage to the thick-gate IC devices.

To safeguard the thick-gate core pull-down transistors 212 and 222, embodiments herein utilize at least two reference voltage voltages, which are configured to maximize overdrive voltage that is available across the thick-gate IC devices. For example, a first reference voltage VREFN and a second reference voltage VREFP are applied to overdrive control transistors 224 to ensure maximum overdrive across the second stage level shifter circuitry 220. In various embodiments, the first reference voltage is greater than the second reference voltage. According to various embodiments, VREFN may be a first percentage of a high voltage level in the second domain (e.g., $VDD_{IO}$) and VREFP may be second percentage of the high voltage level. For example, VREFN may be 55% of $VDD_{IO}$ (e.g., VREFN=0.55*$VDD_{IO}$) and VREFP may be 45% of $VDD_{IO}$ (e.g., VREFP=0.45*$VDD_{IO}$) in a case where $VDD_{IO}$ is set to 3.3V. As described above, the core pull-down transistors 212 and 222 may have electrical overstress limit of 1.98V or less, and by applying VREFN and VREFP as set forth above (e.g., VREFN=1.815V and VREFP=1.485V) the core pull-down transistors 212 and 222 are not exposed to voltage levels that exceed their respective electrical overstress limits. For example, applying VREFN and VREFP as set forth herein maximizes the overdrive voltage across the devices of the second stage level shifter circuitry 220, such that any nMOS devices experience transitions between $VSS_{IO}$ and VREFN and any pMOS devices experience transitions between VREFP and $VDD_{IO}$. Thus, for example, pMOS devices see a change of $VDD_{IO}$ minus VREFP, such as a 1.98V or less transition in the case that $VDD_{IO}$ is 3.6V at a maximum (e.g., $VDD_{IO}$ is 3.6V and VREFP is 1.62V), and nMOS devices see a change from 0 V to 1.98V (e.g., VREFN). Moreover, the reference voltages VREFN and VREFP via overdrive control transistors 224 may result in increased current in the second stage level shifter circuitry 220, which translates to increases in performance such as speed. For example, the current is increased due to a higher overdrive voltage. That is, as compared to the conventional design of FIG. 1, where VREF was 50% of $VDD_{IO}$, the embodiments disclosed herein provide a 5% higher voltage across a device (e.g., VREFN is 55% of $VDD_{IO}$), which translates to approximately 20-25% higher current.

Moreover, the thick-gate core pull-down transistors 212 and 222 are further protected from electrical overstress by splitting the level shifter into two separate stages. That is, providing first and second stage level shifter circuitry 210 and 220 removes the overdrive limitations on gain devices, discussed above. For example, the first stage level shifter circuitry 210 converts the input signal V_IN in the first domain to a first intermediate signal that transitions between a high level and a low level in an intermediate domain (also referred to as a third domain). In an illustrative example, the V_IN transitions between high and low voltage signals in the first domain (e.g., between $VDD_{CORE}$ and $VSS_{CORE}$) and the first stage level shifter circuitry 210 converts this input signal into first stage output voltage V_OUT_STG1 that transitions between the first reference voltage VREFN and a low voltage level in the intermediate domain (e.g., between VREFN and $VSS_{IO}$). Then, the second stage level shifter circuitry 220 converts the first stage output voltage V_OUT_STG1 in the intermediate domain to a second intermediate signals that transitions between a high level and a low level in the second domain. In an illustrative example, the second stage level shifter circuitry 220 converts first stage output voltage V_OUT_STG1 into V_OUT that transitions between the first reference voltage $VDD_{IO}$ and $VSS_{IO}$ in the second domain. Accordingly, as alluded to above, in the first stage 210, where the first voltage domain is converted to the intermediate voltage domain, cascodes are not needed for reliability protection as maximum overstress seen by any device is less than 1.98V. The N-to-P device ratio can be reduced by 50%. In the second stage 220, where the intermediate voltage domain is converted to the second voltage domain, the nMOS devices have much higher current capability because they are driven by VREFN. Thus, N-to-P ratio can be reduced drastically to between 2 to 4 time, which helps in gaining speed.

The level shifter 200 is also scalable to support multiple operating voltages in the second domain. That is, $VDD_{IO}$ may be set to different voltage levels in the second domain, which the level shifter 200 is capable of supporting while maintaining safeguards to electrical overstress and improved performance. For example, $VDD_{IO}$ may be set to 1.8V in a case where operating voltage of the environment external to the core IC supports an operating voltage of 1.8V. Alternatively, $VDD_{IO}$ may be set to 3.3V in a case where operating voltage of the environment external to the core IC requires 3.3V (e.g., to provide for backward compatibility and/or satisfy operating specifications/requirements). In an illustrative example, support of multiple operating voltages may be achieved by setting the first and second reference voltages VREFN and VREFP based on the input voltage $VDD_{IO}$. That is, for example, the first and second percentages applied to the $VDD_{IO}$ may be selected according to the input voltage $VDD_{IO}$. For example, as described above, when $VDD_{IO}$ is 3.3V, VREFN may be 55% of $VDD_{IO}$ and VREFP may be 45% of $VDD_{IO}$. Thus, the first stage circuitry 210 transitions from logic low level to logic high levels in the intermediate voltage domain (e.g., operating voltages between $VSS_{IO}$ and VREFN), while the second stage circuitry 220 transitions in the second voltage domain (e.g., between VREFN and $VDD_{IO}$). Since VREFN is higher than $VDD_{core}$, circuit 200 achieves much larger overdrive and gains switching speed.

Alternatively, when $VDD_{IO}$ is 1.8V, VREFN may be 100% of $VDD_{IO}$ and VREFP may be 0% of $VDD_{IO}$, because there is no overstress protection needed across devices of the circuitry. Thus, to provide highest overdrive across pMOS and nMOS, VREFN can be set to $VDD_{IO}$ while VREFP is set to 0. While operating voltages of 1.8V and 3.3V are used in this disclosure, it will be appreciated that other operating voltages in the second domain are applicable as desired by the environment external to the level shifter 200.

Additionally, by splitting the level shifter architecture into two stages, the change in the voltage (referred to as delta-V) between the first and second stage level shifter circuitry 210 and 220 is reduced by 50%. For example, the first stage 210 converts from $VDD_{CORE}$ to VREFN and then the second stage converts from VREFN to $VDD_{IO}$. Thus, the delta-V between each conversion is reduced, at least with respect to the conventional level shifter design which converted directly from $VDD_{CORE}$ to $VDD_{IO}$. The reduced delta-V enables the N-to-P device ratio to be reduced by 2-3 times, thereby reducing the parasitic capacitance at output nodes as compared to the conventional cross-coupled level shifter described in connection with FIG. 1 (e.g. having a device ratio of 10-15 times). These aspects enable the level shifter 200 according to the embodiments disclosed herein to achieve improved performance, such as, higher frequency, sharp rise and fall transitions, and minimum intersymbol interference.

The second stage level shifter circuitry 220 further includes booster transistors 226. The booster transistors 226 provide for zero DC current and low power consumption by the second stage level shifter circuitry 220. For example, a first subset of booster transistors 226 are driven by the first stage output voltage V_OUT_STG1 and coupled to the first reference voltage VREFN. Based on the logic level of the first stage output voltage V_OUT_STG1, the first subset of booster transistors 226 drive one of a first complementary output node of the second stage level shifter circuitry 220 to the first reference voltage VREFN, without having to wait for overdrive control transistors 224 to charge the first complementary output node. A second subset of booster transistors 226 drive the second reference voltage to a second complimentary=output nodes based on the logic level of the first stage output voltage V_OUT_STG1. As a result, output voltages on the complimentary output nodes are rail-to-rail. That is, transitions from 0 to VREFN and/or VREFP to $VDD_{IO}$ are clear and sharp, unlike the transitions provided by the conventional level shifter of FIG. 1 (see FIGS. 5A-5D described below). Thus, signal transitions are quite fast and there is no Vt loss on signals resulting larger current. Embodiments herein comprises complimentary devices placed so to ensure there are no subthreshold current dependency, thereby avoiding the Vt loss on the signals and ensure fast transitions, unlike that of the subthreshold dependency described in relation to FIG. 1. Accordingly, driving devices (e.g., inventers described in connection with FIG. 3D below) do not burn additional crowbar current due to the clear and sharp transitions.

Figure 3C:
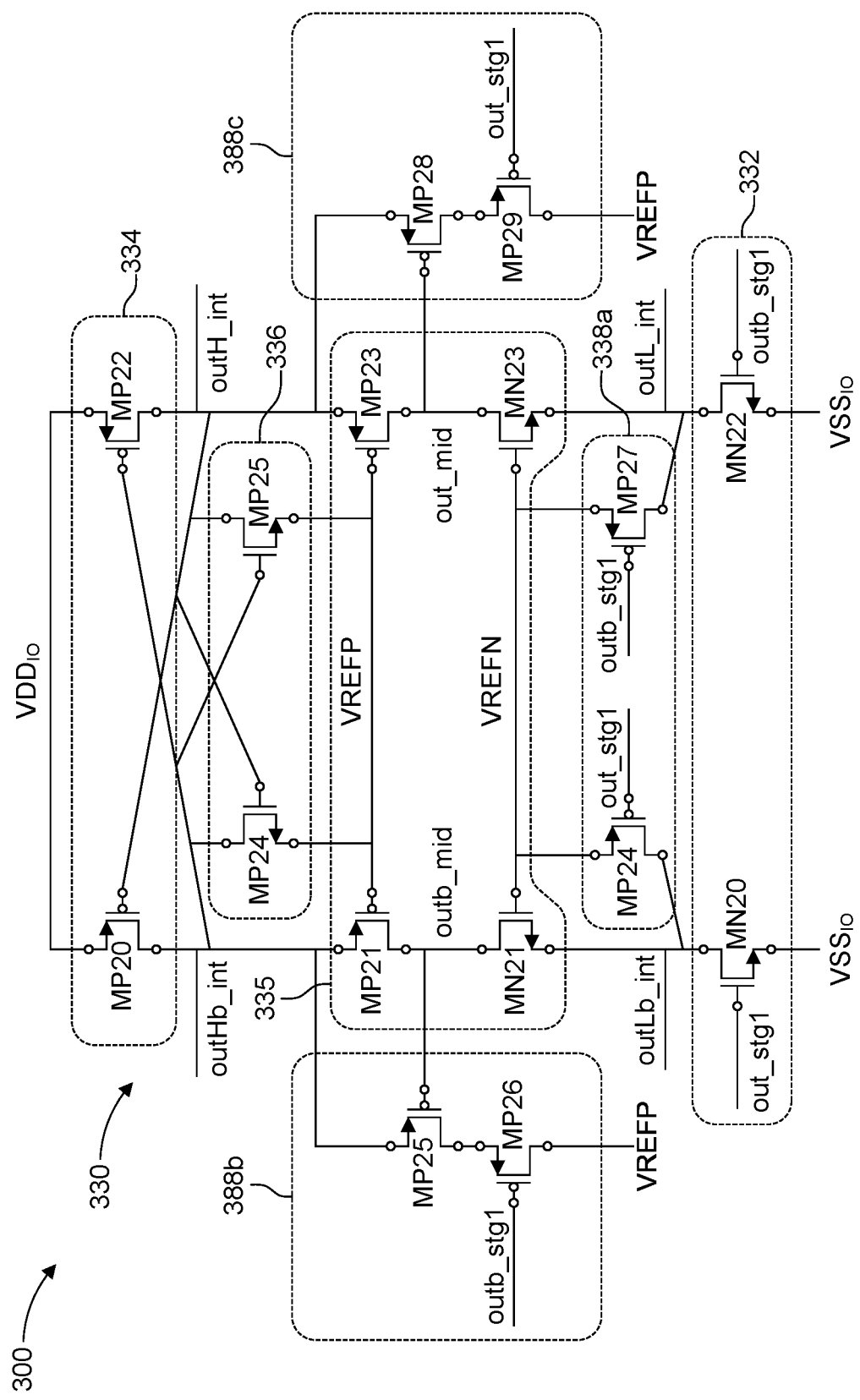

After the logic action of the latch 228 is complete, the voltage at a particular output node of the level shifter 200 may be logically inverted by inverter 230 to produce output voltage V_OUT. The output voltage V_OUT may be at the same logic level as the input voltage V_IN, where V_OUT has a voltage level in the second domain. In particular, the latch 228 may maintain the output voltage V_OUT at the same logic level as the input voltage V_IN, but at a voltage level in the second domain, by remaining in a corresponding latch state until a logic level of the input voltage V_IN changes, at which point, the latch 228 may undergo a logic state transition to the other latch state so as to produce an output voltage V_OUT that is at the same logic level as the logic level to which V_IN has changed. For example, in a case where V_IN is at a logic high level and at a voltage level of $VDD_{CORE}$, V_OUT may be at the logic high level having a voltage level of $VDD_{IO}$, while in a case where V_IN is at a logic low level and at a voltage level of $VSS_{CORE}$, V_OUT may be at the logic low level having a voltage level of $VSS_{IO}$ FIGS. 3A, 3B, and 3C depict an example circuit implementation 300 of the two-stage high-speed level shifter 200 according to example embodiments of the disclosed technology. FIGS. 4A through 4E are flowcharts depicting example methods of operation 400a, 400b, and 400c of the two-stage high-speed level shifter according to example embodiments of the disclosed technology. The methods of operation 400a-400c will be described hereinafter in the context of the example circuit implementation 300 depicted across FIGS. 3A-3D.

Referring first to FIGS. 3A-3D, the circuit 300 includes input circuitry 310, a first stage level shifter circuit 320, a second stage level shifter circuit 330, and output circuitry 340. Input circuitry 310 and output circuitry 340 may be substantially similar to the input circuitry 110 and output circuitry 130, respectively, as described in connection with FIG. 1. As such, input circuitry 310 is configured to generate input signals INN and INP based on an input signal IN at a voltage level VIN in the first domain. VIN may be transition between high voltage level $VDD_{CORE}$ and low voltage level $VSS_{CORE}$, respectively, of a first voltage domain. For example, input circuitry 310 may include a pair of inverters 312 and 314. The first inverter 312 may be configured to receive the input signal VIN and generate signal INN by logically inverting VIN and send the signal INN to the first stage circuit 320 and the second inverter 314. The second inverter 314 may be configured to generate the signal INP by logically inverting the signal INN and send the signal INP to the first stage circuit 320. The first and second inventors 312 and 314 may be thin-gate IC devices capable of supporting operating voltage levels in the first voltage domain.

The first stage circuit 320 may be an example circuit implementation of the first stage level shifter circuitry 210 of FIG. 2. The first stage circuit 320 converts the input signal IN that transitions between a high level ($VDD_{CORE}$) and a low level ($VSS_{CORE}$) in the first domain to a first stage output signal that transitions between a high voltage level and a low voltage level of an intermediate domain (also referred to as a third domain). In the example circuit 320, the intermediate domain may include a first reference voltage level VREFN and a low voltage level $VSS_{IO}$ between which the first stage output signal transitions. The first reference voltage level VREFN may be higher than the high voltage level $VDD_{CORE}$. Additionally, low voltage levels $VSS_{CORE}$, $VSS_{IO}$ may both be ground reference voltages in the first and second domains, respectively. In various embodiments, $VDD_{CORE}$ may be 0.9V and VREFN may be a first percentage of $VDD_{IO}$ in the second domain, such as, 55% of $VDD_{IO}$ in a case where $VDD_{IO}$ is set to 3.3V or 100% of $VDD_{IO}$ in a case where $VDD_{IO}$ is set to 1.8V.

The first stage circuit 320 includes first core pull-down transistors 322, which may be nMOS transistors or other suitable semiconductor devices and are illustratively depicted in FIG. 3B as MN10 (also referred to herein as a first core pull-down transistor of the first stage circuit) and MN11 (also referred to herein as a second core pull-down transistor of the first stage circuit). In various embodiments, the first core pull-down transistors 322 may be thick-gate IC devices, for example, devices have gate thickness of 35 Å. First core pull-down transistors 322 is an example circuit implementation of first core pull-down transistors 212 of FIG. 2. The first stage circuit 320 also includes a cross-coupled latch 324 formed by pMOS devices or other suitable semiconductor devices, illustratively shown as MP10 (also referred to herein as a first latch transistor of the first stage circuit) and MP11 (also referred to herein as a second latch transistor of the first stage circuit). First latch transistors 324 is an example circuit implementation of first latch transistors 214 of FIG. 2. Drain terminals of MP10 and MP11 are coupled to drain terminals of MN10 and MN11, respectively. Source terminals of MP10 and MP11 are coupled to VREFN and source terminal of MN10 and MN11 are coupled to $VSS_{IO}$. The gate terminals of MN11 and MN10 are coupled to INN and INP, respectively. As alluded to above, transistors MN10 and MN11 are driven by VREFN (e.g., 55% of $VDD_{IO}$), which reduces the size of MN10 and MN11 (as compared to MN0 and MN2 of FIG. 1) by a factor of 2 to 3 and helps in gaining speed.

As will be described below, the circuit 320 generates a first stage output signal that includes a pair of first stage complimentary signals based on VREFN, INN, and INP. For example, circuit 320 generates signal out_stg1 and its complimentary signal outb_stg1 at a voltage level in the intermediate voltage domain. As shown in FIG. 3B, the signal out_stg1 is generated at a first node (e.g., out_stg1 node) coupled to drain terminals of MP11 and MN11, and the complimentary signal outb_stg1 generated at a second node (e.g., outb_stg1 node) coupled to drain terminals of MP10 and MN10. Furthermore, a gate terminal of the MP10 is coupled to the drain terminal of the MP11 and configured to receive the signal out_stg1, and a gate terminal of MP11 is coupled to the drain terminal of MP10 and configured to receive the complimentary signal outb_stg1.

The second stage circuit 330 may be an example circuit implementation of the second stage level shifter circuitry 200 of FIG. 2. The second stage circuit 330 converts the stage output signal from the first stage circuit 320 in the intermediate domain to an output signal VOUT signal that transitions between a high level and a low level in the second voltage domain. In the example circuit 330, the second domain may include a high voltage level $VDD_{IO}$ and a low voltage level $VSS_{IO}$. The high voltage level $VDD_{IO}$ may be higher than VREFN. In various embodiments, $VDD_{IO}$ may be set to the desired operating voltage (e.g., 1.8V, 3.3V, etc.).

With reference to FIG. 3C, the second stage circuit 330 includes core pull-down transistors 332 that receive out_stg1 and outb_stg1 from the first stage circuit 320. Second core pull-down transistors 332 is an example circuit implementation of second core pull-down transistors 222 of FIG. 2. Core pull-down transistors 332 may be nMOS transistors or other suitable semiconductor devices and are illustratively depicted in FIG. 3C as MN20 (also referred to herein as a first core pull-down transistor of the second stage circuit) and MN22 (also referred to herein as a second core pull-down transistor of the first stage circuit) having gate terminals coupled to out_stg1 and outb_stg1, respectively. The second stage circuit 330 also includes a primary cross-coupled latch 334 formed by pMOS devices or other suitable semiconductor devices, illustratively shown as MP20 (also referred to herein as a first latch transistor of the second stage circuit) and MP22 (also referred to herein as a second latch transistor of the second stage circuit); a secondary cross-coupled latch 336 formed by pMOS transistors or other suitable semiconductor devices, illustratively shown as MN24 and MN25; first, second, and third groups of booster transistors 338a, 338b, and 338c, respectively; and overdrive control transistors 335, which may be pMOS and/or nMOS transistors or other suitable semiconductor devices and illustratively shown as first through fourth overdrive transistors MP21, MP25, MN21, and MN23. The primary cross-coupled latch 334, overdrive control transistors 335, and booster transistors 338a-338c are example circuit implementations of second latch 228, overdrive control transistors 224, and booster transistors 226 of FIG. 2, respectively. In some embodiments, the secondary cross-coupled latch 336 in combination with the primary cross-coupled latch 334 may be an example implementation of second latch 228. Booster transistors 338a-338c may be pMOS transistors or other suitable semiconductor devices and are illustratively shown as first booster transistor MP24 and second booster transistor MP27 as first group of booster transistors 338a (e.g., an example circuit implementation of the first subset of booster transistors described in connection with FIG. 2), while third booster transistor MP26 and fourth booster transistor MP25 are illustrative of second group of booster transistors 338b and fifth booster transistor MP28 and sixth booster transistor MP29 are illustrative of third group of booster transistors 338c (e.g., booster transistors 338b and 338c are example circuit implementations of the second subset of booster transistors described in connection with FIG. 2). In various embodiments, the various transistor of the second stage circuit 330 may be thick-gate IC devices, for example, devices have gate thickness of 35 Å.

As illustrated in FIG. 3C, source terminals of MN20 and MN22 are coupled to $VSS_{IO}$ and drain terminals are coupled to drain terminals of MP24 and MP27, respectively. Moreover, the drain terminals of MN20 and MN22 are coupled to source terminals of MN21 and MN23, respectively. Gate terminals of MN21 and MN23 are coupled to VREFN as well as source terminals of MP24 and MP27, respectively.

Gate terminals of MP24 and MP27 receive out_stg1 and outb_stg1 from circuit 320, respectively. Drain terminals of MN21 and MN23 are coupled to drain terminals of MP21 and MP23, respectively, which have gate terminal coupled to a second reference voltage VREFP. The gate terminals of MP21 and MP23 are also coupled to source terminals of MN24 and MN25. Source terminals of MP21 and MP23 are coupled to drain terminals of MP20 and MP22, respectively, as well as coupled to drain terminals of MN24 and MN25. A gate terminal of the MP20 is coupled to the drain terminals of MP22 and MN25, as well as coupled to the source terminal of MP23 and a gate terminal of MN24. A gate terminal of the MP22 is coupled to the drain terminals of MP20 and MN24, as well as coupled to the source terminal of MP21 and a gate terminal of MN25. The source terminals of MP20 and MP22 are coupled to $VDD_{IO}$. In various embodiments, VREFP may be a second percentage of $VDD_{IO}$ in the second domain, such as, 45% of $VDD_{IO}$ in a case where $VDD_{IO}$ is set to 3.3V or 0% of $VDD_{IO}$ in a case where $VDD_{IO}$ is set to 1.8V. As alluded to above, transistors the nMOS transistors of FIG. 3C are driven by VREFN (e.g., 55% of $VDD_{IO}$), which reduces the size of the nMOS transistors (as compared to MN0 and MN2 of FIG. 1) by a factor of 2 to 3 and helps in gaining speed.

Furthermore, MP21 and MP23 are coupled to booster transistors 338b and 338c, respectively. For example, the source terminal of MP21 is coupled to the source terminal of MP25 and the drain terminal of MP21 is coupled to a gate terminal of MP25. The drain terminal of MP25 is coupled to a source terminal of MP26, which has a gate terminal that receives outb_stg1 from circuit 320 and a drain terminal that receives VREFP. Similarly, the source terminal of MP23 is coupled to the source terminal of MP28 and the drain terminal of MP23 is coupled to a gate terminal of MP28. The drain terminal of MP28 is coupled to a source terminal of MP29, which has a gate terminal that receives out_stg1 from circuit 320 and a drain terminal that receives VREFP.

As will be described below, the circuit 330 generates pairs of second intermediate complimentary signals (also referred to as second stage or stage two complimentary signals) based on VREFN, VREFP, out_stg1, and outb_stg1. For example, circuit 330 generates signal outH_int and its complimentary signal outHb_int at a first voltage level in the second voltage domain. As shown in FIG. 3C, the signal outH_int is generated at a node coupled to the drain terminal of MP22, and the complimentary signal outHb_int is generated at a node coupled to the drain terminal of MP20. Furthermore, the gate terminals of the MP20 and MN24, coupled to the drain terminal of the MP22, receive the signal outH_int, and the gate terminals of MP22 and MN25, coupled to the drain terminal of MP20, receive the complimentary signal outHb_int.

Additionally, circuit 330 generates signal outL_int and its complimentary signal outLb_int at a second voltage level, lower than the first voltage level, in the second voltage domain. As shown in FIG. 3C, the signal outL_int is generated at a node coupled to the drain terminals of MN20 and MP24 and source terminal of MN21, and the complimentary signal outLb_int is generated at a node coupled to the drain terminals of MN22 and MP27 and source terminal of MN23.

Figure 4A:
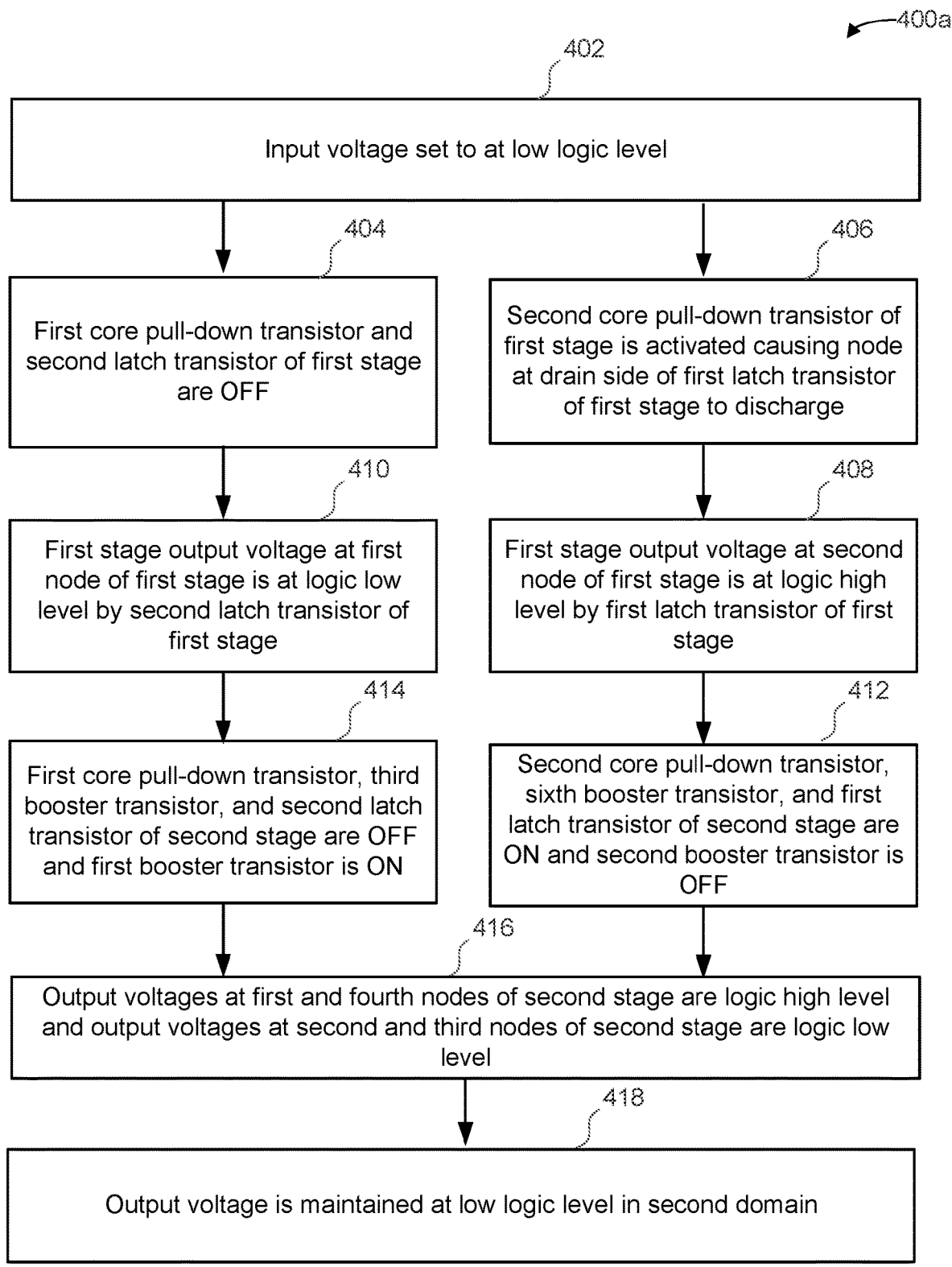
FIGS. 4A-4E are flowcharts depicting example methods of operation of a the two-stage level shifter of FIG. 2 according to example embodiments of the disclosed technology.

Referring now to FIG. 4A, at block 402 of method 400, the input voltage IN is set to logic low level (e.g., 0). When IN is at logic low level, VIN is as at low voltage level $VSS_{CORE}$. The input voltage level $VSS_{CORE}$ is logically inverted by inverter 312 setting INN to logic high level, which generates a voltage level of $VDD_{CORE}$ at INN. INN is then logically inverted by inverter 314 setting INP to logic low level, which generates a voltage of $VSS_{CORE}$. As a result of INP at logic low level and INN at logic high level, core pull-down transistors MN10 is OFF, block 404, and MN11 is ON, block 406. Further, latch transistor MP10 is ON (block 406) because when MN11 switched ON, it pulled down on a drain side node of latch transistor MP10, which results in a gate voltage being applied to MP10 that is sufficient to turn MP10 ON. The latch transistor MP11, however, remains OFF (block 404). As a result of MP10 being ON and MP11 being OFF, the voltage at second stage node outb_stg1 is at a logic high level (block 408) and the voltage at first stage node out_stg1 is at a logic low level (410). Due to VREFN applied to the MP10, the voltage level at first stage complimentary node outb_stg1 is VREFN, while the voltage at the complimentary node outb_stg1 is $VSS_{IO}$.

As a result of the voltage at outb_stg1 at logic high level, second core pull-down transistor MN22 is turned ON and second booster transistor MP27 is OFF (block 412). Due to MN22 being ON, first complementary output node outL_int discharges to $VSS_{IO}$ (e.g., a logic low level), which turns ON first overdrive control transistor MN23. Further, out_stg1 is at logic low level, which turns second core pull-down transistor MN20 is OFF and first booster transistor MP24 is ON (block 414). As a result of MP24 being ON and MN20 being OFF, the first complementary output node outLb_int charges to VREFN, without having to wait for MN21 to charge the node. That is, MP24 operates in conduction state and charges the node without relying on MN21 with operates in the subthreshold conduction as the voltage approaches VREFN. Thus, a waveform of the transition from a logic low level (e.g., $VSS_{IO}$) to logic high level (e.g., VREFN) at outLb_int is sharper than conventional level shifters (e.g., FIG. 1B), which means the logic transition happens cleanly and quickly.

When MN22 is ON, it pulls down on a drain side node of second overdrive control transistor MP23, which results in a gate voltage applied to MP23 that is sufficient to turn MP23 ON. Additionally, MP21, MP28, and MP29 are turned ON due to out_stg1 at logic low level. Further, latch transistor MP20 is ON because when fifth booster transistor MP28 is ON, due to sixth booster transistor MP29 being turned ON (block 412), MP28 pulls down on a drain side node of latch transistor MP20, which results in a gate voltage being applied to MP20 that is sufficient to turn MP20 ON. Additionally, as a result of MP24 and MN20 being OFF, MN21 is OFF. Third booster transistor MP25 and fourth booster transistor MP26 are OFF due to outb_stg1 being at logic high level, which turns MP22 OFF. As a result of MP20 being ON and MP11 being OFF, the voltage at first node outH_int discharges to a logic low level and the voltage at the complimentary node, second node outHb_int, charges to a logic high level. Due to $VDD_{IO}$ applied to the MP20, the voltage level at second node outHb_int is at $VDD_{IO}$, while the voltage at the first node outH_int is VREFP.

For example, as a result of MP 28 being ON, the node outH_int discharges to VREFP, without having to wait for MP23 to discharge the node. That is, MP28 operates in conduction region due to its gate terminal connected to drain terminal of MP23 at out_mid node and discharges the node outH_int without relying on MP23, which operates in the subthreshold conduction region as the voltage level at the node approaches VREFP. Thus, a waveform of the transition from a logic high level (e.g., $VDD_{IO}$) to logic low level (e.g., VREFP) at outH_int is sharper than conventional level shifters (e.g., FIG. 1B), which means the logic transition happens cleanly and quickly.

The second stage output voltages are provided to the output circuitry 340 and, at block 418, the output voltage VOUT is maintained at the logic low level having a voltage level of the second voltage domain based on inverting the second stage output voltages. For example, second stage circuit 330 output signals includes outH_int, outHb_int, outL_int, and outLb_int at VREFP (e.g., logic low level), $VDD_{IO}$ (e.g., logic high level), $VSS_{IO}$ (e.g., logic low level), and VREFN (e.g., logic high level), respectively. The output circuitry 340 processes the second stage output signals and outputs OUTH, OUTHB, OUTL, and OUTLB at voltage levels of the second voltage domain. For example, outHb_int is inverted by inverter 342 (also referred to herein as a driver device 342) to produce output voltage OUTHB, the intermediate node voltage outH_int is inverted by inverter 344 (or driver device 344) to produce output voltage OUTH, intermediate node voltage outLb_int is inverted by inverter 346 (or driver device 346) to produce output voltage OUTLB, and the intermediate node voltage outL_int is inverted by inverter 348 (or driver device 348) to produce output voltage OUTL. Thus, when the input voltage IN is at the logic low level (e.g., outH_int is at logic low level at a voltage level of VREFP, outHb_int is at logic high level at a voltage level of $VDD_{IO}$, outL_int is at logic low level at a voltage level of $VSS_{IO}$, and outLb_int is at logic high level at a voltage level of VREFN), the output circuitry 340 outputs signals OUTH=$VDD_{IO}$, OUTHB=VREFP, OUTLB=$VSS_{IO}$, and OUTL=VREFN. As a result of the sharper and cleaner transitions described above, the inverters 342-348 of the output circuit 340 do not consume crowbar current, which reduces leakage in the devices.

According to various embodiments, the second stage circuit 330 implemented using thick-gate IC devices. As a result, the voltage across a pair terminals of any transistor in the second stage circuit 330 cannot exceed the electrical overstress limit. For example, as the devices are thick-gate IC device, the electrical overstress limit is 2V (or 1.8V in some implementations), and if the voltage across a transistor exceeds this limit the circuit will go into electrical overstress (EOS) and burn up. Accordingly, the second stage circuit 330 includes the two reference voltages (e.g., VREFN and VREFP) to avoid this condition. The VREFN is applied to the nMOS transistors and selected to drive the transistors at a maximum voltage (e.g., 2V) across the transistors. Similarly, VREFP is applied to pMOS transistors and selected to drive the transistors at a maximum voltage (e.g., 2V). Using a single reference voltage results in that one of the transistors types would be driven below the maximum voltage due to the differences in operation of nMOS and pMOS transistors, and would experience a loss in overdrive, for example, 200 mV of overdrive.

Additionally, secondary cross-coupled latch 336 are provided to increase speed of charging/discharging of connected nodes. For example, transistors MN24 and MN25 are provided as nMOS transistors (e.g., opposite polarity of primary cross-coupled latch 334), which turn ON responsive to a difference in voltage. Transistor MN24 functions to further increase discharging speed at node outH_int to $VDD_{IO}$, while transistor MN25 increases charging speed at node outHb_int.

Figure 4B:
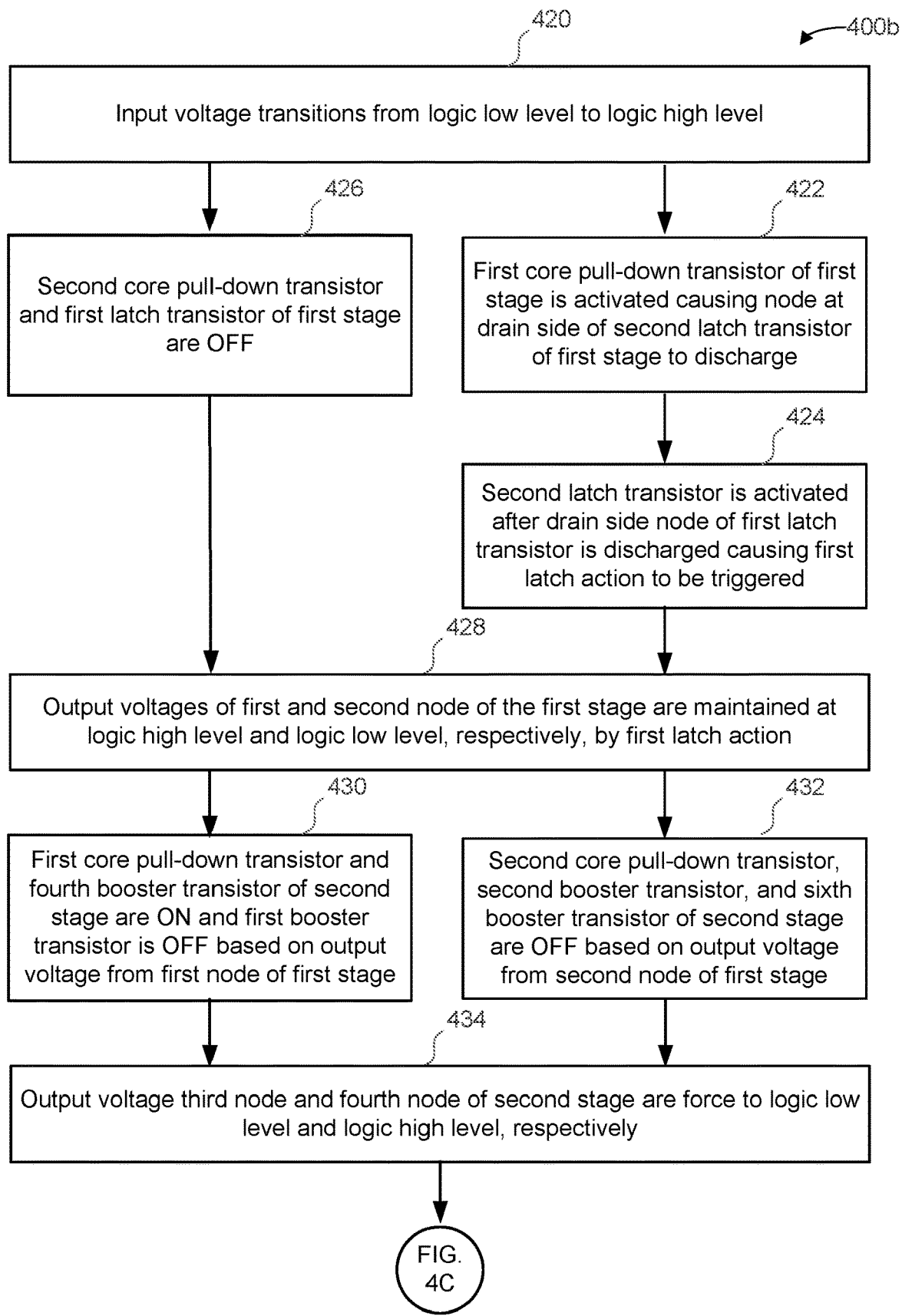

Next referring to FIG. 4B, at block 420 of method 400b, the input voltage VIN into circuit 300 transitions from logic low level to logic high level. Prior to this transition, the input voltage VIN is at the logic low level, e.g., as described in method 400*a*. The input voltage level VDD$_{CORE}$ is logically inverted by inverter 312 setting INN to logic low level, which generates a voltage level of VSS$_{CORE}$ at INN. INN is then logically inverted by inverter 314 setting INP to logic low level, which generates a voltage of VDD$_{CORE}$.

At block 422, as a result of INN at logic low level, core pull-down transistor MN10 is turned ON. Further, latch transistor MP11 is turned ON because when MN10 is switched ON, it pulls down on a drain side node of latch transistor MP11, which results in a gate voltage being applied to MP11 that is sufficient to turn MP11 ON. Turning ON of MP11 triggers a first latch action (block 424), forcing MP11 to turn OFF. For example, at block 424, the drain side node outb_stg1 of MP10 pulls down on the gate terminal of MP11, resulting in output voltage at second node outb_stg1 going to the logic low level and out_stg1 charging to the logic high level (block 428), thereby generating a voltage at node out_stg1 of VREFN. The latch action then maintains output voltage at first node out_stg1 at VREFN. In parallel, due to INP transitioning to logic low level, MN11 and MP10 are turned OFF (block 426). Consequently, output voltage at first node out_stg1 is latched at VREFN during the latch action.

Due to out_stg1 transitioning from logic low level to logic high level (e.g., VSS$_{IO}$ to VREFN) and outb_stg1 transitioning from logic high to logic low level at block 428, first core pull-down transistor MN20 and fourth booster transistor MP26 are turned ON and first booster transistor MP24 is turned OFF at block 430 due to out_stg1 at logic high level applied to respective gate terminals. Additionally, due to outb_stg1 at logic low level, second core pull-down transistor MN22 and sixth booster transistor MP29 are turned OFF and second booster transistor MP27 is turned ON (block 432). As a result, at block 434, the third node outL_int is charges to logic high level and generates a voltage at node outL_int of VREFN and fourth node outLb_int discharges to logic low level and generates a voltage at node outLb_int of VSS$_{IO}$.

Figure 4C:
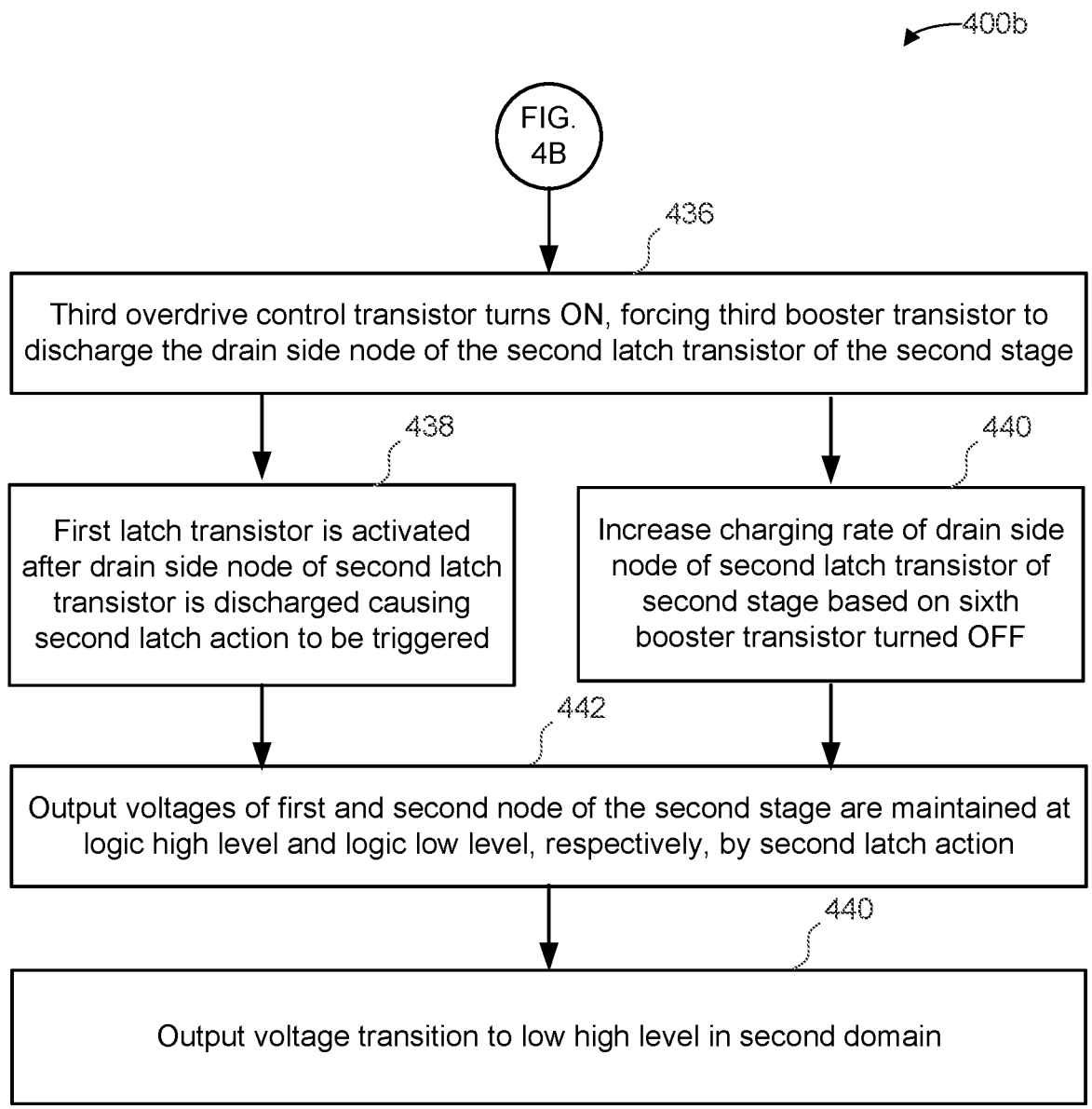

Turning to FIG. 4C, as outLb_int discharges to logic low level at block 434, third overdrive control transistor MN21 turns ON at block 436. Turning MN21 ON forces a voltage at node outb_mid coupled to the drain terminal of MN21 to discharge, which enables booster transistor MP25 to discharge the drain side node of MP20 (e.g., second node outHb_int) from VDD$_{IO}$ toward VREFP. Discharging of node outHb_int triggers a second latch action, forcing MP22 to turn ON, block 438. For example, the drain side node of MP20 (e.g., second node outHb_int) pulls down on the gate terminal of MP22, resulting in outH_int charging to the logic high level, thereby generating a voltage at node outH_int of VDD$_{IO}$ (block 442). The latch action then maintains outH_int at VDD$_{IO}$. In parallel, at block 440, sixth booster transistor MP29 is turned OFF due to out_stg1 transitioning to logic low level, which increases a charging rate of node outH_int and increases the discharge rate of outHb_int to the logic low level (e.g., VREFP), for example, by turning MP20 OFF quickly. This operation reduces current leakage though MP20 so to ensure that second node outHb_int and node outb_mid reach logic low level.

As a result of the first node outH_int at logic high level, at block 442, overdrive control transistor MP23 is turned ON due to node outH_int transitioning to logic high level. As a result, node out_mid transitions to logic high level and charges to VDD$_{IO}$.

The second stage output voltages at blocks 434 and 442 are provided to the output circuitry 340 and, at block 440, the output voltage VOUT transitions to the logic high level having a voltage level of the second domain based on inverting the second stage output voltages. Thus, when the input voltage IN transitions to the logic high level (e.g., outH_int is at logic high level at a voltage level of VDD$_{IO}$, outHb_int is at logic low level at a voltage level of VREFP, outL_int is at logic high level at a voltage level of VREFN, and outLb_int is at logic low level at a voltage level of VSS$_{IO}$), the output circuitry 340 outputs signals OUTH=VREFP, OUTHB=VDD$_{IO}$, OUTLB=VREFN, and OUTL=VSS$_{IO}$.

Figure 4D:
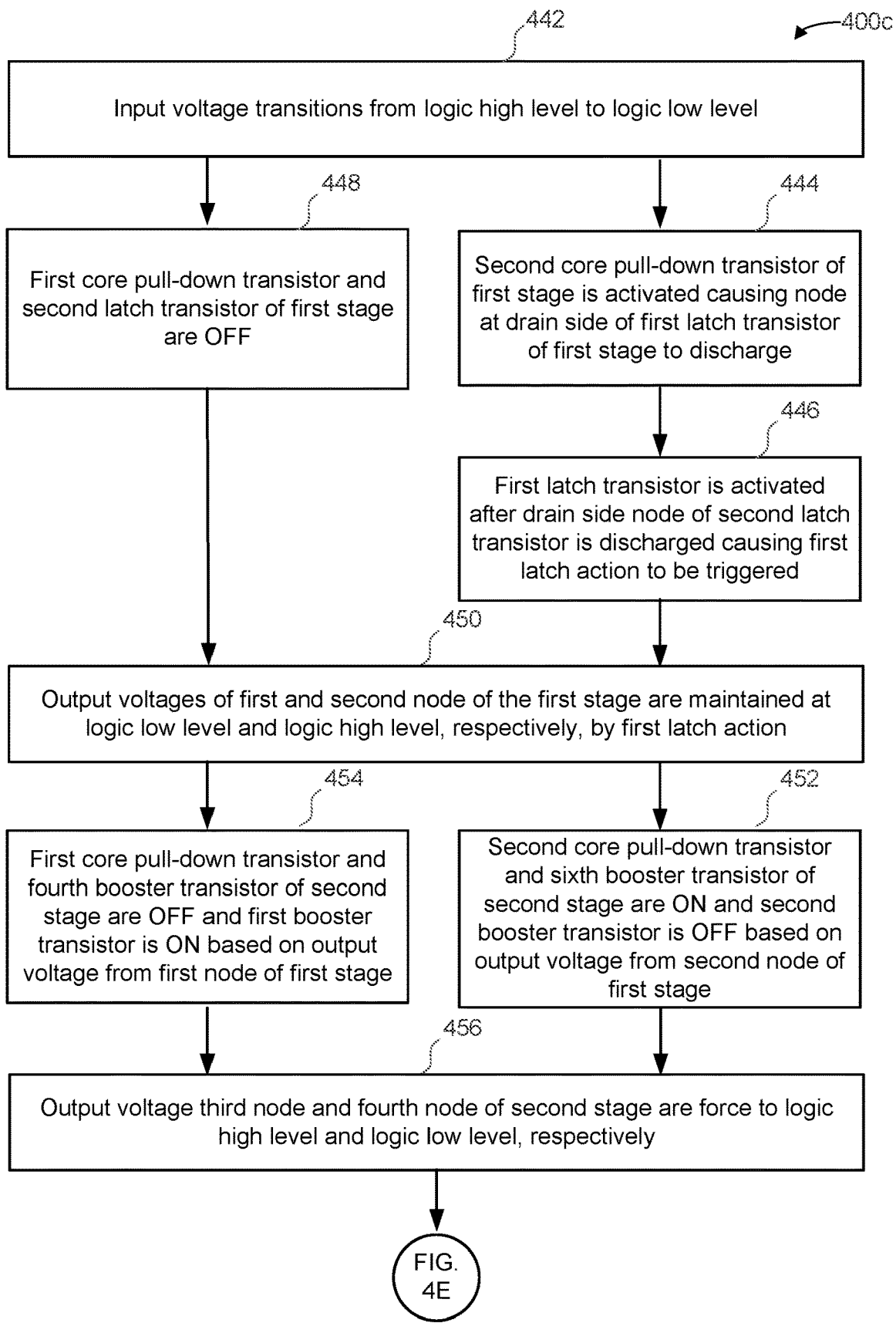

Referring now to FIG. 4D, at block 442, the input voltage VIN into circuit 300 transitions from logic high level (e.g., VDD$_{CORE}$) to logic low level (e.g., VSS$_{CORE}$). Prior to this transition, the input voltage VIN is at the logic high level, e.g., as described in block 4Y1. The input voltage level VSS$_{CORE}$ is logically inverted by inverter 312 setting INN to logic high level, which generates a voltage level of VDD$_{CORE}$ at INN. INN is then logically inverted by inverter 314 setting INP to logic high level, which generates a voltage of VSS$_{CORE}$.

At block 444, as a result of INP at logic high level, core pull-down transistor MN11 is turned ON. Further, latch transistor MP10 is turned ON because when MN11 is switched ON, it pulls down on a drain side node of latch transistor MP10, which results in a gate voltage being applied to MP10 that is sufficient to turn MP10 ON. Turning ON of MP10 triggers a first latch action, forcing MP10 to turn OFF (block 446). For example, the drain side node outb_stg1 of MP10 pulls down on the gate terminal of MP10, resulting in outb_stg1 going to the logic high level and out_stg1 discharging to the logic low level (block 450), thereby generating a voltage at node outb_stg1 of VREFN. The latch action then maintains outb_stg1 at VREFN. In parallel, due to INP transitioning to logic low level, MN10 and MP11 are turned OFF (block 448). Consequently, outb_stg1 is latched at VREFN during the latch action.

Due to outb_stg1 transitioning from logic low level to logic high level (e.g., VSS$_{IO}$ to VREFN) and out_stg1 transitioning from logic high to logic low level at block 450, the method of 400*c* proceeds reciprocally to method 400*b* such that the opposite side of circuit 300 operates in a manner similar to steps 430-440. For example, core pull-down transistor MN22 and booster transistor MP26 are turned ON and booster transistor MP27 is turned OFF at block 452 due to outb_stg1 at logic high level applied to respective gate terminals. Additionally, due to out_stg1 at logic low level, core pull-down transistor MN20 and booster transistor MP29 are turned OFF and booster transistor MP24 is turned ON (block 454). As a result, at block 456, the node outLb_int is forced to logic high level and generates a voltage at node outLb_int of VREFN and node outL_int is forced to logic low level and generates a voltage at node outL_int of VSS$_{IO}$.

Figure 4E:
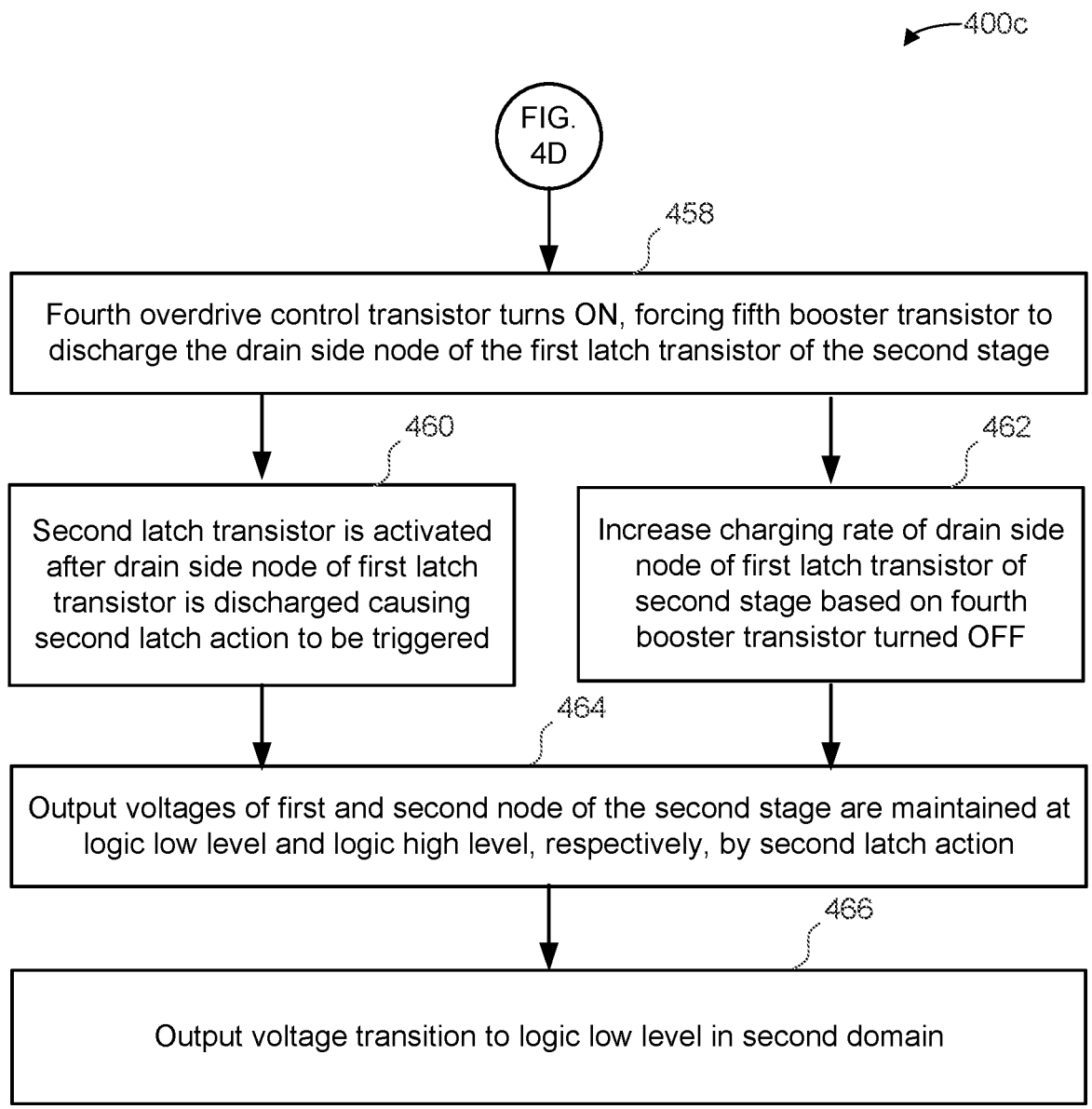

Turning to FIG. 4E, as outL_int transitions to logic low level at block 456, fourth overdrive control transistor MN23 turns ON at block 458. Turning MN23 ON forces a signal at node out_mid coupled to the drain terminal of MN23 to discharge, which enables fifth booster transistor MP28 to discharge the drain side node of MP22 (e.g., first node outH_int) from VDD$_{IO}$ toward VREFP. Discharging of node outH_int triggers a second latch action, forcing MP20 to turn ON, block 460. For example, the drain side node of MP22 (e.g., first node outH_int) pulls down on the gate terminal of MP20, resulting in outHb_int charging to the logic high level, thereby generating a voltage at node outHb_int of VDD$_{IO}$ (block 464) The latch action then maintains outHb_int at VDD$_{IO}$. In parallel, at block 462, booster transistor MP26 is turned OFF due to outb_stg1 transitioning to logic low level, which increases a charging rate of node outHb_int and increases the discharge rate of outH_int to the logic low level (e.g., VREFP), for example, by turning MP22 OFF quickly. As described above, this operation reduces current leakage though MP22 so to ensure that node outH_int and node out_mid reach logic low level.

As a result of the second node outHb_int at logic high level at block 464, fourth overdrive control transistor MP21 is turned ON due to node outHb_int transitioning to logic high level. As a result, node outb_mid transitions to logic high level and charges to $VDD_{IO}$.

The second stage output voltages at blocks 456 and 464 are provided to the output circuitry 340 and, at block 466, the output voltage VOUT transitions to the logic low level having a voltage level of the second domain based on inverting the second stage output voltages. Thus, when the input voltage IN transitions to the logic high level (e.g., outH_int is at logic low level at a voltage level of VREFP, outHb_int is at logic high level at a voltage level of $VDD_{IO}$, outL_int is at logic low level at a voltage level of $VSS_{IO}$, and outLb_int is at logic high level at a voltage level of $VDD_{IO}$), the output circuitry 340 outputs signals OUTH=$VDD_{IO}$, OUTHB=VREFP, OUTLB=$VSS_{IO}$, and OUTL=VREFN.

Figure 5A:
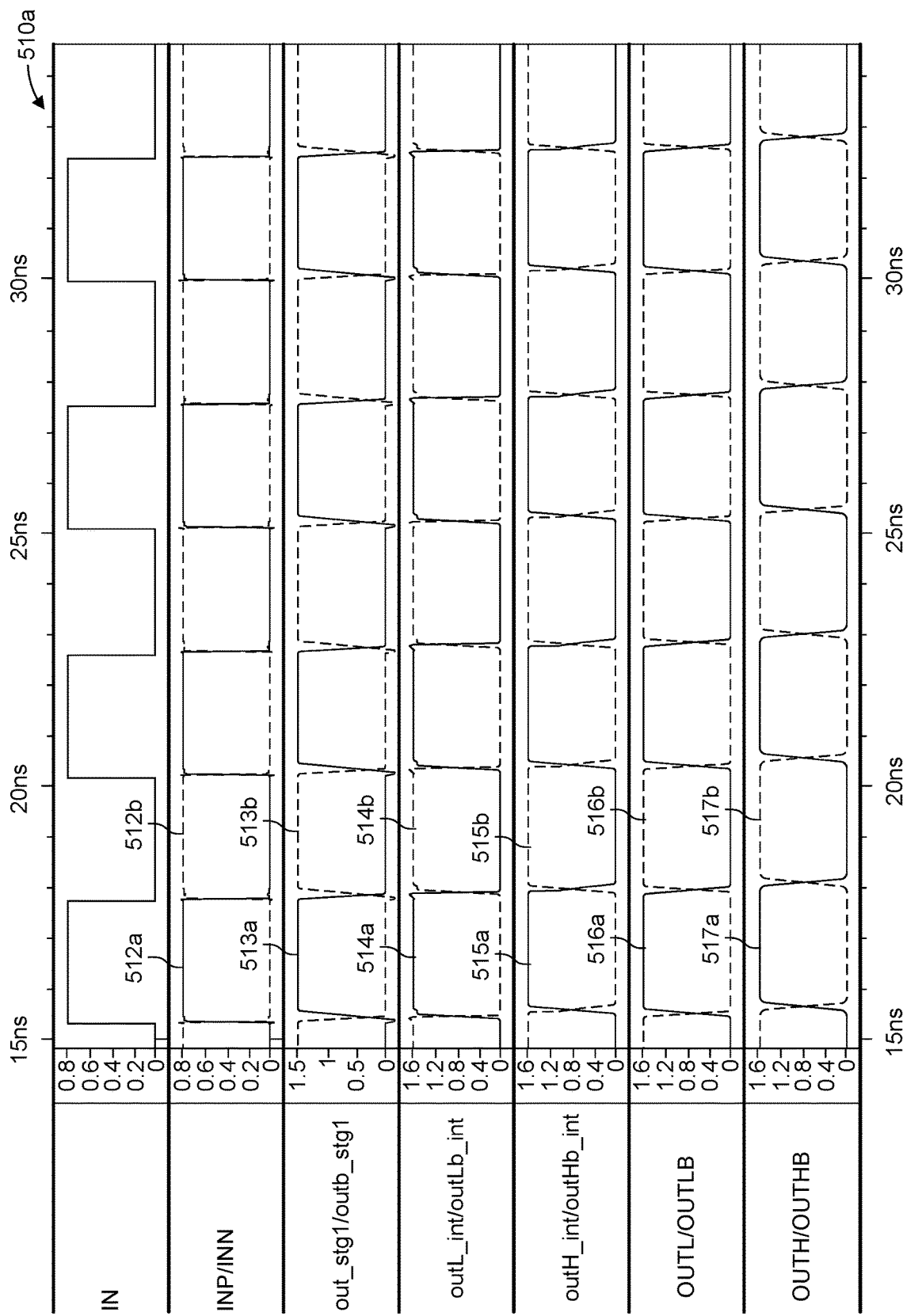
FIGS. 5A and 5B are plots of waveforms of various voltage signals over the course of multiple latch state transitions of a two-stage high-speed voltage level shifter according to embodiments of the disclosed technology.
Figure 5B:
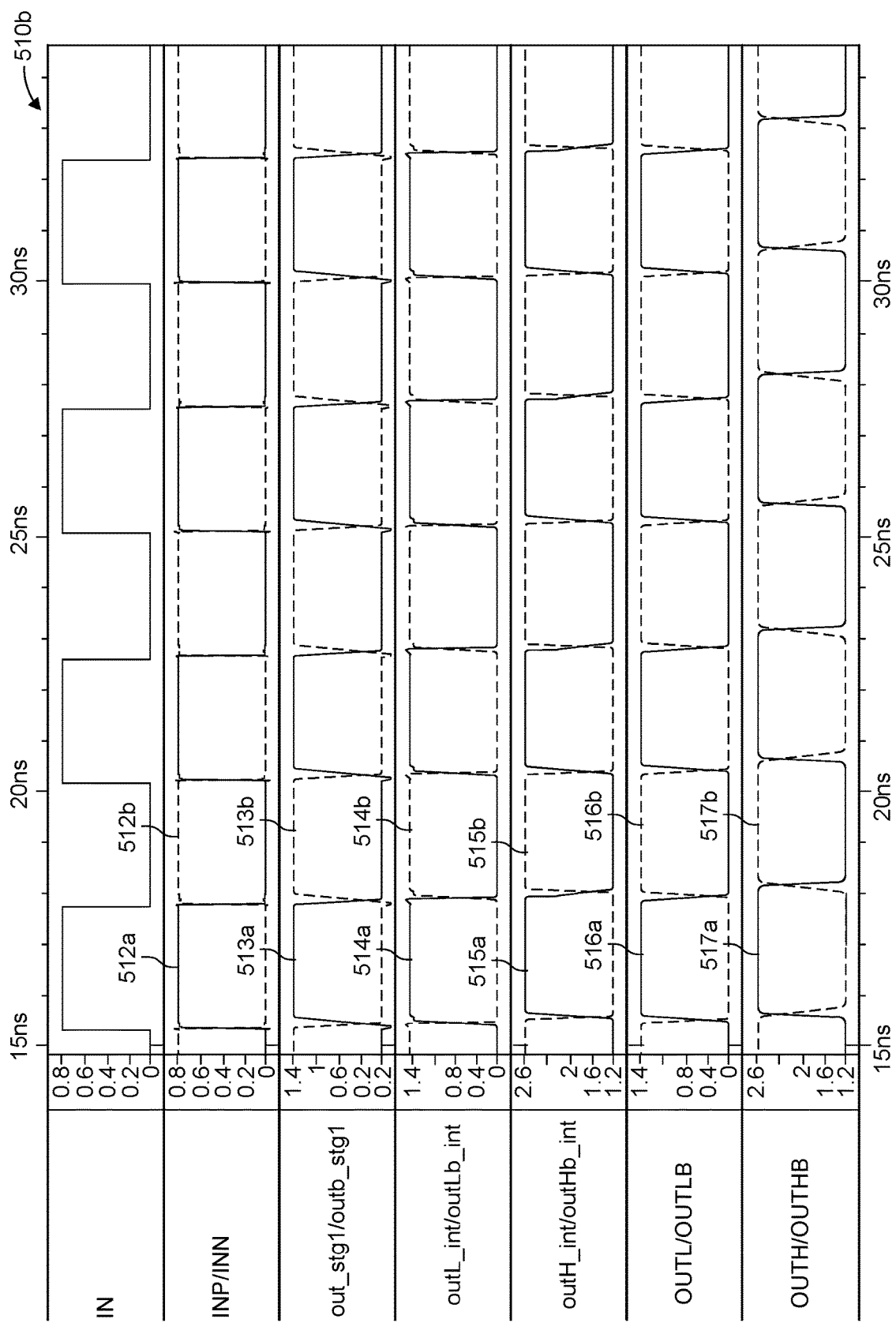

FIGS. 5A and 5B are plots 510a and 510b, respectively, of waveforms of various voltage signals over the course of multiple latch state transitions of a voltage level shifter according to example embodiments of the disclosed technology. For both plots 510a and 510b, an input voltage signal IN may be supplied to the level shifter 200, which may have the example circuit implementation 300 depicted in FIGS. 3A-3D. The input voltage signal IN may oscillate between a logic high level (e.g., 0.8V) and a logic low level (e.g., 0V). Voltage signals INP 512a and INN 512b may be complementary signals. As previously noted, voltage signal INN may be obtained by inverting the input voltage signal IN, and the voltage signal INP 512a may be obtained by inverting the voltage signal INN 512b. Thus, when the input voltage signal IN is at a logic high level, the voltage signal INN 512b is at a logic low level, while the voltage signal INP 512a is at a logic high level. This is illustrated in FIGS. 5A and 5B. Further, as previously noted, the voltage signal INN may be supplied to first stage core pull-down transistor MN11, while the voltage signal INP may be supplied to first stage core pull-down transistor MN10.

FIGS. 5A and 5B additionally depict waveforms output from the first stage level shifter circuitry 210, which may have an example circuit implementation 320 depicted in FIG. 3B; output from the second stage level shifter circuitry 220, which may have an example circuit implementation 330 depicted in FIG. 3C; and an output circuit, which may have an example circuit implementation 340 depicted in FIG. 3D. FIGS. 5A and 5B are substantially similar, except that $VDD_{IO}$ is set to 1.8V to generate waveforms plot 510a and $VDD_{IO}$ is set to 3.3V to generate waveforms plot 510b. Thus, as shown in FIGS. 5A and 5B depict additional waveforms for voltages observed at out_stg1 514a and outb_stg1 514b. As shown in FIG. 5, when the input voltage IN transitions to the logic high level, the output signal out_stg1 514a also subsequently transitions to the logic high level, while the complementary output signal outb_stg1 514b transitions to the logic low level. Also illustrated in FIG. 5A are waveforms for voltages observed at outL_int 515a and outLb_int 515b; outH_int 516a and outHb_int 516b; OUTL 517a and OUTLB 517b; and OUTH 518a and OUTHB 518b. As shown in FIG. 5A, when out_stg1 513a transitions to logic high level, outL_int 515a and outH_int 516b transition to logic high level, while outLb_int 515b and outHb_int 516b transition to logic low level. The output signals OUTL 517a and OUTH 518a also subsequently transition to the logic high level, while the complementary output voltage signals OUTLB 517b and OUTHB 517b transition from logic high level to logic low level.

Figure 5C:
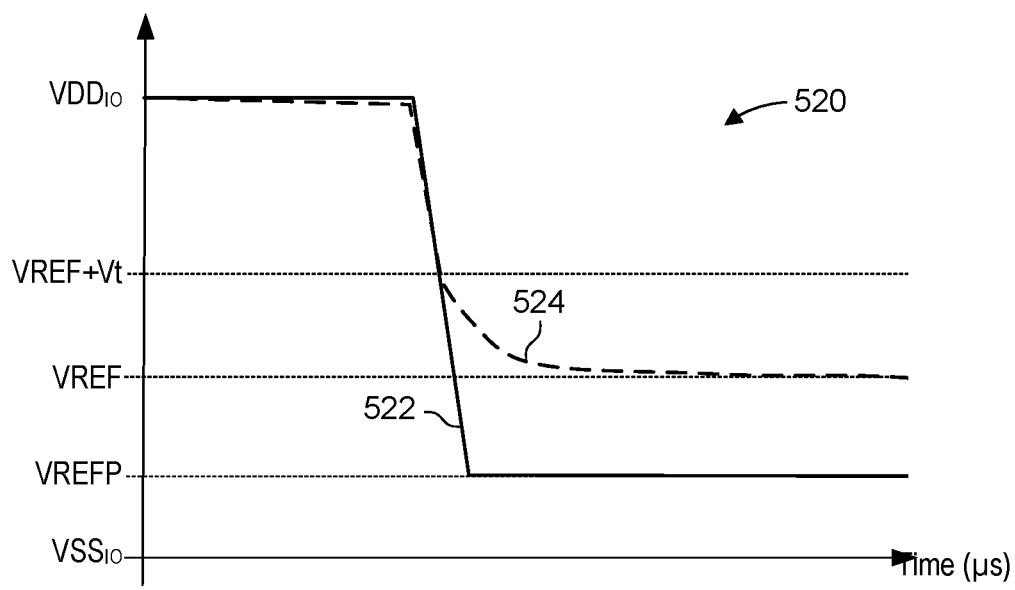
FIGS. 5C and 5D are plots of waveforms of voltage signals of a two-stage high-speed voltage level shifter according to embodiments of the disclosed technology compared to voltage of the voltage level shifter of FIG. 1.

FIG. 5C is a plot 520 of waveforms of voltage signals of a voltage level shifter according to example embodiments of the disclosed technology (e.g., FIGS. 2 and 3A-3D) compared to the voltage signals of the conventional voltage level shifter of FIG. 1. Plot 520 depicts waveforms 522 and 524 of voltage signals over one latch state transition. Waveform 522 represents a voltage signal generated at either the outH_int or the outHB_int nodes of FIG. 3C, depending on the logic level of the input circuit 310. Waveform 524 represents a voltage signal generated at either the outH_int or the outHB_int nodes of FIG. 1. As can be seen from FIG. 5C, the waveform 522 provides for a much sharper and cleaner transition from $VDD_{IO}$ to VREFP as compared to the waveform 524. As explained above, the embodiments disclosed herein generating waveform 522 remove the dependency on the subthreshold condition of the transistors, thereby providing for the sharp and clean waveform 522. As a result, faster and clearer transitions can be achieved.

Figure 5D:
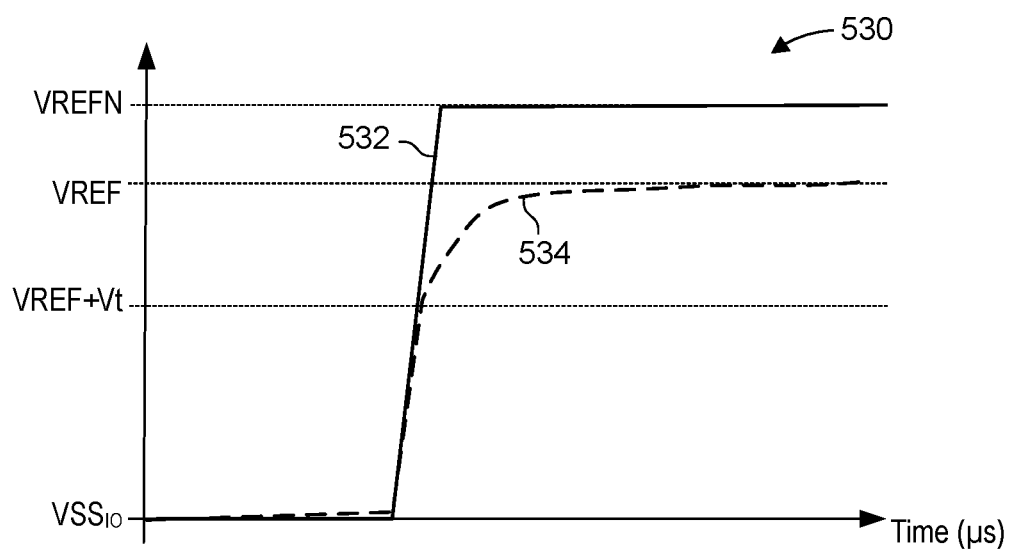

FIG. 5D is another plot 530 of waveforms of voltage signals of a voltage level shifter according to example embodiments of the disclosed technology (e.g., FIGS. 2 and 3A-3D) compared to the voltage signals of the conventional voltage level shifter of FIG. 1. Plot 530 depicts waveforms 532 and 534 of voltage signals over one latch state transition. Waveform 522 represents a voltage signal generated at either the outL_int or the outLB_int nodes of FIG. 3C, depending on the logic level of the input circuit 310. Waveform 534 represents a voltage signal generated at either the outL_int or the outLB_int nodes of FIG. 1. As can be seen from FIG. 5D, similar to FIG. 5C, the waveform 532 provides for a much sharper and cleaner transition from $VSS_{IO}$ to VREFN as compared to the waveform 534.

Table1 below compares a conventional cross-coupled level shifter, such as the level shifter depicted in FIG. 1, and two-stage cross-coupled level shifters according to the embodiments disclosed herein, such as the example level shifter described in connection with FIGS. 2-4E. As shown in Table 1, the conventional cross-coupled level shifter cannot scale to meet high-performance requirements at operating voltages of 1.8V (e.g., as indicated by "Not working" and "N.A", while the embodiments disclosed herein outperform the convention level shifters, at least, in the areas of power and performance.

TABLE 1

| Parameters | Conventional Level Shifter | Two-Stage Cross-Coupled Level Shifter |
| --- | --- | --- |
| Duty Cycle | Not working | 48.92-50.50 |
| Delay | Not working | 860 ps |
| Area | 1× | 1.2× |
| Current(Avg) | N.A | 22.5 uA |
| Static Current-DC(1/0) | N.A | 150 nA |

Figure 6:
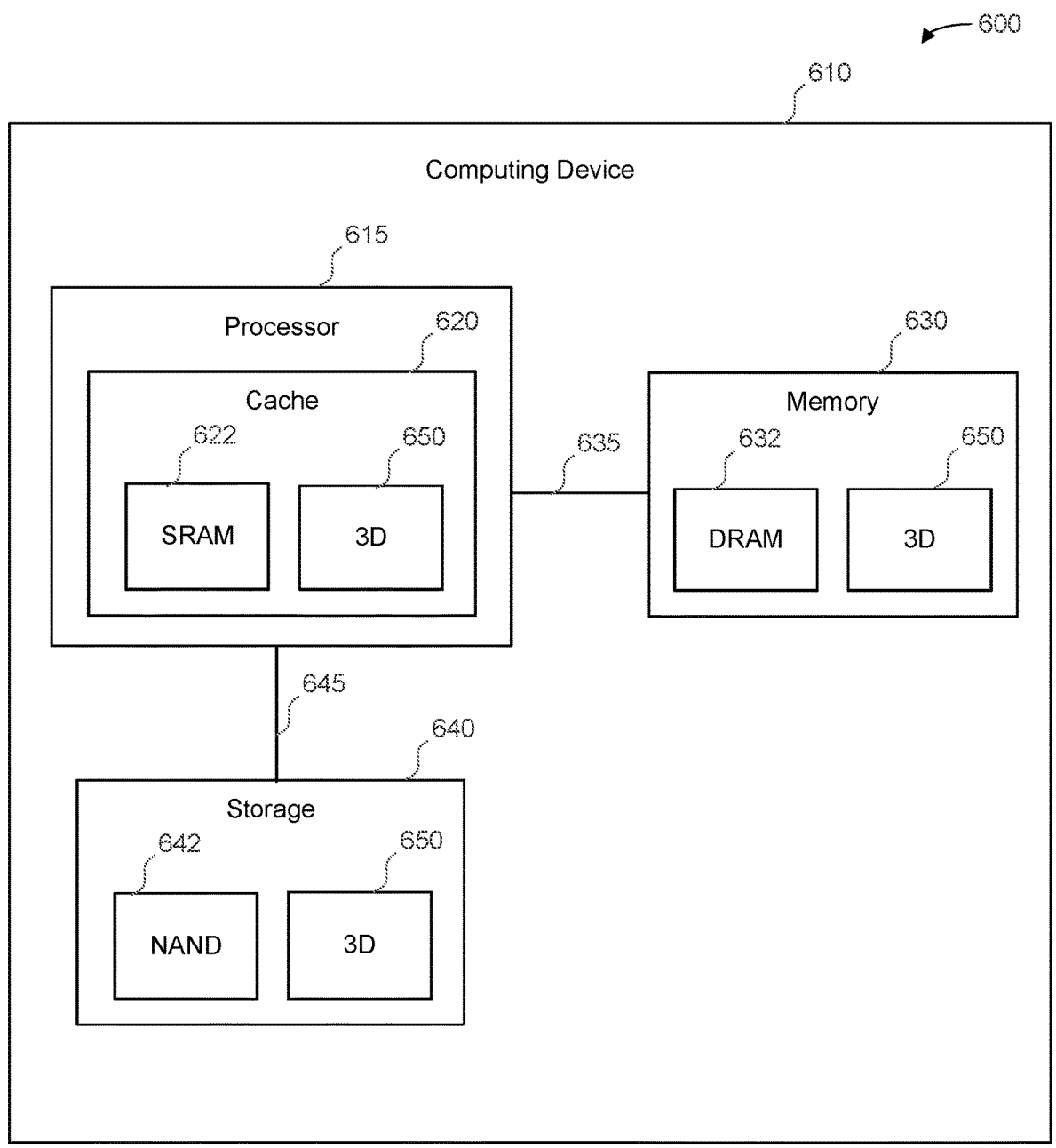
FIG. 6 is a schematic block diagram of a system in which a voltage level shifter according to embodiments of the disclosed technology may be implemented.

FIG. 6 depicts a system 600 comprising three-dimensional memory 650. The system 600 may include one or more voltage level shifters according to embodiments of the disclosed technology. The voltage level shifter(s) may be provided to perform voltage domain translation between any two components or instances of components depicted in FIG. 6. In the depicted embodiment, the system includes a computing device 610. In various embodiments, a computing device 610 may refer to any electronic device capable of computing by performing arithmetic or logical operations on electronic data. For example, a computing device 610 may be a server, a workstation, a desktop computer, a laptop computer, a tablet, a smartphone, a control system for another electronic device, a network attached storage device, a block device on a storage area network, a router, a network switch, or the like. In certain embodiments, a computing device 610 may include a non-transitory, computer readable storage medium that stores computer readable instructions configured to cause the computing device 610 to perform steps of one or more of the methods disclosed herein.

In the depicted embodiment, the computing device 610 includes a processor 615, a memory 630, and storage 640. In various embodiments, a processor 615 may refer to any electronic element that carries out the arithmetic or logical operations performed by the computing device 610. For example, in one embodiment, the processor 615 may be a general-purpose processor that executes stored program code. In another embodiment, a processor 615 may be a field-programmable gate array (FPGA), an application-specific integrated circuit (ASIC), or the like, that operates on data stored by the memory 630 and/or the storage 640. In a certain embodiment, a processor 615 may be a controller for a storage device (e.g., on a storage area network), a networking device, or the like.

In the depicted embodiment, the processor 615 includes a cache 620. In various embodiments, a cache 620 may store data for use by the processor 615. In certain embodiments, a cache 620 may be smaller and faster than the memory 630, and may duplicate data in frequently-used locations of the memory 630, or the like. In certain embodiments, a processor 615 may include a plurality of caches 620. In various embodiments, a cache 620 may include one or more types of memory media for storing data, such as static random access memory (SRAM) 622, three-dimensional memory 650, or the like. For example, in one embodiment, a cache 620 may include SRAM 622. In another embodiment, a cache 620 may include three-dimensional memory 650. In a certain embodiment, a cache 620 may include a combination of SRAM 622, three-dimensional memory 650, and/or other memory media types.

The memory 630, in one embodiment, is coupled to the processor 615 by a memory bus 635. In certain embodiments, the memory 630 may store data that is directly addressable by the processor 615. In various embodiments, a memory 630 may include one or more types of memory media for storing data, such as dynamic random access memory (DRAM) 632, three-dimensional memory 650, or the like. For example, in one embodiment, a memory 630 may include DRAM 632. In another embodiment, a memory 630 may include three-dimensional memory 650. In a certain embodiment, a memory 630 may include a combination of DRAM 632, three-dimensional memory 650, and/or other memory media types.

The storage 640, in one embodiment, is coupled to the processor 615 by a storage bus 645. In certain embodiments, the storage bus 645 may be a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 640 may store data that is not directly addressable by the processor 615, but that may be accessed via one or more storage controllers. In certain embodiments, the storage 640 may be larger than the memory 630. In various embodiments, a storage 640 may include one or more types of storage media for storing data, such as a hard disk drive, NAND flash memory 642, three-dimensional memory 650, or the like. For example, in one embodiment, a storage 640 may include NAND flash memory 642. In another embodiment, a storage 640 may include three-dimensional memory 650. In a certain embodiment, a storage 640 may include a combination of NAND flash memory 642, three-dimensional memory 650, and/or other storage media types.

In various embodiments, three-dimensional memory 650 may be used to store data in a cache 620, memory 630, storage 640, and/or another component that stores data. For example, in the depicted embodiment, the computing device 610 includes three-dimensional memory 650 in the cache 620, memory 630, and storage 640. In another embodiment, a computing device 610 may use three-dimensional memory 650 for memory 630, and may use other types of memory or storage media for cache 620 or storage 640. Conversely, in another embodiment, a computing device 610 may use three-dimensional memory 650 for storage 640, and may use other types of memory media for cache 620 and memory 630. Additionally, some types of computing device 610 may include memory 630 without storage 640 (e.g., in a microcontroller) if the memory 630 is non-volatile, may include memory 630 without a cache 620 for specialized processors 615, or the like. Various combinations of cache 620, memory 630, and/or storage 640, and uses of three-dimensional memory 650 for cache 620, memory 630, storage 640, and/or other applications will be clear in view of this disclosure.

In various embodiments, the three-dimensional memory 650 may include one or more chips, packages, die, or other integrated circuit devices comprising three-dimensional memory arrays with multiple layers of memory cells, disposed on one or more printed circuit boards, storage housings, and/or other mechanical and/or electrical support structures. For example, one or more dual inline memory modules (DIMMs), one or more expansion cards and/or daughter cards, a solid-state-drive (SSD) or other storage device, and/or another memory and/or storage form factor may comprise the three-dimensional memory 650. The three-dimensional memory 650 may be integrated with and/or mounted on a motherboard of the computing device 610, installed in a port and/or slot of the computing device 610, installed on a different computing device 610 and/or a dedicated storage appliance on a network, in communication with a computing device 610 over an external bus, or the like.

The three-dimensional memory 650, in various embodiments, may include one or more memory dies. A memory die may include multiple layers of memory cells in a three-dimensional memory array. In various embodiments, three-dimensional memory may include magnetoresistive RAM (MRAM), phase change memory (PCM), resistive RAM (ReRAM), NOR Flash memory, NAND Flash memory, Silicon-Oxide-Nitride-Oxide-Silicon (SONOS) memory, or the like.

In certain embodiments, the three-dimensional memory 650 may include a plurality of planar memory cells forming a three-dimensional array, a plurality of word lines extending horizontally across the layers (e.g., in-plane), and a plurality of selector columns or pillars extending vertically through the plurality of layers. In further embodiments, the selector columns or pillars may be coupled to the memory cells, and may include central conductors surrounded by one or more concentric selective layers. In various embodiments, one or more selective layers may permit an electrical current through a cell, between a word line and a central conductor, in response to a voltage satisfying a threshold. In certain embodiments, a selector column or pillar that extends through a plurality of layers of planar memory cells may facilitate reading to or writing from individual memory cells by limiting leakage current through other cells. Additionally, in further embodiments, forming a selector pillar or column that extends through a plurality of layers may simplify manufacturing compared to forming selector devices in individual layers alternating with memory cell layers.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium that may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A voltage level shifter, comprising:
a first cross-coupled latch comprising a first latch transistor and a second latch transistor, wherein a drain terminal of the first latch transistor is connected to a gate terminal of the second latch transistor and a drain terminal of the second latch transistor is connected to a gate terminal of the first latch transistor;
a plurality of overdrive control transistors comprising a first subset of transistors having gate terminals connected to a first reference voltage and a second subset of transistors having gate terminals connected to a second reference voltage, wherein source terminals of the second subset of transistors are connected to the first cross-coupled latch; and
a first plurality of pull-down transistors comprising a first pull-down transistor and a second pull-down transistor, wherein a drain terminal of the first pull-down transistor and a drain terminal of the second pull-down transistor are connected to source terminals of the first subset of transistors.

2. The voltage level shifter of claim 1, further comprising:
a first plurality of booster transistors comprising a first booster transistor and a second booster transistor, a drain terminal of the first booster transistor is connected to the first pull-down transistor and a source terminal of the first booster transistor is connected to the first reference voltage, and a drain terminal of the second booster transistor is connected to the second pull down transistor and a source terminal of the second booster transistor is connected to the first reference voltage.

3. The voltage level shifter of claim 2, wherein the first plurality of booster transistors drives nodes between the first and second pull-down transistors and the plurality of overdrive control transistors.

4. The voltage level shifter of claim 1, wherein the first latch transistor, the second latch transistor, and the second subset of transistors are p-channel metal-oxide-semiconductor field-effect transistors (MOSFET), wherein the first pull-down transistor, the second pull-down transistor, the first subset of transistors are n-channel MOSFETs.

5. The voltage level shifter of claim 1,
wherein the first subset of transistors comprises a first overdrive control transistor and a third overdrive control transistor, wherein gate terminals of the first and third overdrive control transistors are connected to the first reference voltage,
wherein the second subset of transistors comprises a second overdrive control transistor and a fourth overdrive control transistor, wherein gate terminals of the second and fourth overdrive control transistors are connected to the second reference voltage, and
wherein drain terminals of the first and third overdrive control transistors are connected to drain terminals of the second and fourth overdrive control transistors, respectively.

6. The voltage level shifter of claim 5, wherein the first reference voltage is larger than the second reference voltage.

7. The voltage level shifter of claim 5, further comprising:
a second plurality of booster transistors comprising a third booster transistor and a fourth booster transistor, wherein
gate terminals of the third and fourth booster transistors are connected to drain terminals of the fourth and second overdrive control transistors, respectively, and
drain terminals of the third and fourth booster transistors are connected to the drain terminals of the first and second latch transistors, respectively.

8. The voltage level shifter of claim 7, wherein the second plurality of booster transistors drives nodes between the first cross-coupled latch and the plurality of overdrive control transistors.

9. The voltage level shifter of claim 1, further comprising:
a second cross-coupled latch comprising a third latch transistor and a fourth latch transistor,
wherein the third latch transistor comprises: a drain terminal connected to the gate terminal of the second latch transistor, a gate terminal connected to the gate terminal of the first latch transistor, and a source terminal connected to the second reference voltage, and
wherein the fourth latch transistor comprises: a drain terminal connected to the gate terminal of the first latch transistor, a gate terminal connected to the gate terminal of the second latch transistor, and a source terminal connected to the second reference voltage.

10. The voltage level shifter of claim 1, further comprising:
a third cross-coupled latch connected to the first reference voltage; and
a second plurality of pull-down transistors connected to the third cross-coupled latch,
wherein the third cross-coupled latch and the second plurality of pull-down transistors are connected to gate terminals of the first and second pull-down transistors.

11. The voltage level shifter of claim 10, wherein:
the third cross-coupled latch comprises a fifth latch transistor and a sixth latch transistor, a gate terminal of the fifth latch transistor is connected to a gate terminal of the first pull-down transistor and a gate terminal of the sixth latch transistor is connected to a gate terminal of the second pull-down transistor.

12. The voltage level shifter of claim 10, wherein:
the second plurality of pull-down transistors comprises a third pull-down transistor and a fourth pull-down transistor, a drain terminal of the third pull-down transistor is connected to a gate terminal of the first pull-down transistor and a drain terminal of the fourth pull-down transistor is connected to a gate terminal of the second pull-down transistor.

13. An integrated circuit, comprising:
core circuitry configured to operate at voltages in a first voltage domain;
first stage level shifter circuitry configured to translate input voltage signals received from the core circuitry at one or more logic voltage levels in the first voltage domain to intermediate output voltage signals at one or more corresponding logic voltage levels in an intermediate voltage domain; and
second stage level shifter circuitry configured to translate the intermediate output voltage signals received from the first stage level shifter circuitry at one or more logic voltage levels in the intermediate voltage domain to output voltage signals at one or more corresponding logic voltage levels in a second voltage domain.

14. The integrated circuit of claim 13, wherein the first stage level shifter circuitry is connected to a first reference voltage having a voltage level in the intermediate domain, and the second stage level shifter circuitry is connected to a supply voltage having a voltage level in the second domain.

15. The integrated circuit of claim 13, wherein the first stage level shifter circuitry comprises:
first core pull-down circuitry configured to drive a first pair of complementary nodes in the intermediate voltage domain based on the input voltage signals received from the core circuitry; and
first latch circuitry configured to maintain voltage levels in the intermediate voltage domain at the first pair of complementary nodes.

16. The integrated circuit of claim 13, wherein the second stage level shifter circuitry comprises:
second core pull-down circuitry configured to drive a second and third pair of complementary nodes in the second voltage domain based on the intermediate voltage signals received from the first stage level shifter circuitry; and
second latch circuitry configured to maintain voltage levels in the second voltage domain at the first and second pair of complementary nodes.

17. The integrated circuit of claim 16, wherein the second stage level shifter circuitry further comprises:
overdrive control circuitry connected between the second core pull-down circuitry and the second latch circuitry, the overdrive control circuitry comprising a first reference voltage and a second reference voltage, the overdrive control circuitry configured to supply the first reference voltage to the second core pull-down circuitry and apply the second reference voltage to the second latch circuitry.

18. The integrated circuit of claim 17, wherein the second stage level shifter circuitry further comprises:
first booster circuitry connected to the second pull-down circuitry and configured to drive the second pair of complementary nodes to one or more logic voltage levels in the second voltage domain, wherein a logic high voltage level is the first reference voltage.

19. The integrated circuit of claim 17, wherein the second stage level shifter circuitry further comprises:
second booster circuitry connected to the overdrive control circuitry and configured to drive the third pair of complementary nodes to one or more logic voltage levels in the second voltage domain, wherein a logic low voltage level is the second reference voltage.

20. A method, comprising:
activating control circuitry of a first stage level shifter responsive to a transition of an input voltage to the first stage level shifter from a logic low level in a first voltage domain to a logic high level in the first voltage domain, wherein activating the control circuitry causes a first latch of the first stage level shifter to initiate a transition to a first latch state;
maintaining an intermediate voltage of an intermediate node of the first stage level shifter at a logic high level in an intermediate voltage domain while the input voltage is at the logic high level in the first voltage domain;
activating control circuitry of a second stage level shifter responsive to maintaining of the intermediate voltage in the intermediate voltage domain, wherein activating the control circuitry causes a second latch of the second stage level shifter to initiate a transition to a second latch state; and
maintaining an output voltage of an output node of the second stage level shifter at a logic high level in a second voltage domain while the intermediate voltage is at the logic high level in the intermediate voltage domain.

* * * * *